(12) United States Patent
Kawashita et al.

(10) Patent No.: US 8,178,977 B2
(45) Date of Patent: May 15, 2012

(54) SEMICONDUCTOR DEVICE AND METHOD OF MANUFACTURING THE SAME

(75) Inventors: Michihiro Kawashita, Hitachinaka (JP); Yasuhiro Yoshimura, Kasumigaura (JP); Naotaka Tanaka, Kasumigaura (JP); Takahiro Naito, Duesseldorf (DE); Takashi Akazawa, Musashimurayama (JP)

(73) Assignee: Renesas Electronics Corporation, Kanagawa (JP)

( * ) Notice: Subject to any disclaimer, the term of this patent is extended or adjusted under 35 U.S.C. 154(b) by 273 days.

(21) Appl. No.: 12/483,751

(22) Filed: Jun. 12, 2009

(65) Prior Publication Data

US 2009/0309218 A1    Dec. 17, 2009

(30) Foreign Application Priority Data

Jun. 17, 2008  (JP) .................................. 2008-157844

(51) Int. Cl.
*H01L 23/48* (2006.01)
*H01L 21/44* (2006.01)

(52) U.S. Cl. ................. 257/774; 257/737; 257/E23.145; 257/E21.597; 438/667; 438/613; 438/629; 438/700

(58) Field of Classification Search .................. 257/774, 257/737, 686, E23.145, E21.597
See application file for complete search history.

(56) References Cited

U.S. PATENT DOCUMENTS

| 5,229,647 | A  * | 7/1993  | Gnadinger | 257/785 |
|---|---|---|---|---|
| 6,608,371 | B2 * | 8/2003  | Kurashima et al. | 257/686 |
| 6,936,913 | B2 * | 8/2005  | Akerling et al. | 257/686 |
| 7,646,079 | B2 * | 1/2010  | Umemoto | 257/621 |
| 2002/0047210 | A1 * | 4/2002  | Yamada et al. | 257/774 |
| 2002/0151171 | A1 * | 10/2002 | Furusawa | 438/660 |
| 2003/0160325 | A1 * | 8/2003  | Yoneda et al. | 257/758 |
| 2004/0061238 | A1 * | 4/2004  | Sekine | 257/774 |
| 2005/0221601 | A1 * | 10/2005 | Kawano | 438/622 |
| 2007/0052067 | A1 * | 3/2007  | Umemoto | 257/587 |
| 2007/0241457 | A1 |  10/2007 | Ida | |

FOREIGN PATENT DOCUMENTS

| CN | 101055857 A | 10/2007 |
|---|---|---|
| JP | 2000-260934 A | 9/2000 |
| JP | 2007-53149 A | 3/2007 |

* cited by examiner

*Primary Examiner* — Nitin Parekh
(74) *Attorney, Agent, or Firm* — Mattingly & Malur, PC

(57) ABSTRACT

When a through-hole electrode and a rear-surface wire are formed on a rear surface of a chip, a convex portion is formed on the rear surface of the chip due to a rear-surface wiring pad which is a part of the through-hole electrode and the rear-surface wire. This causes the air leakage when the chip is sucked, and therefore, the reduction of the sucking force of the chip occurs. A concave portion is formed in advance in a region where a rear-surface wiring pad and a rear-surface wire are formed. The rear-surface wiring pad and the rear-surface wire are provided inside the concave portion. Thus, a flatness of the rear surface of the chip is ensured by a convex portion caused by thicknesses of the rear-surface wiring pad and the rear-surface wire, so that the reduction of the sucking force does not occur when the chip is handled.

10 Claims, 31 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. JP 2008-157844 filed on Jun. 17, 2008, the content of which is hereby incorporated by reference into this application.

TECHNICAL FIELD OF THE INVENTION

The present invention relates to a semiconductor device and a technique of manufacturing the same. More particularly, the present invention relates to a semiconductor device having a plurality of semiconductor chips stacked three-dimensionally.

BACKGROUND OF THE INVENTION

In recent years, the development of SiP (System in Package) which realizes a high performance system in a short period by packaging a plurality of semiconductor chips (simply referred to as "chip") in high density has been promoted, and various packaging structures have been proposed. More particularly, the development of a stacked-type package which can realize a significant downsizing by stacking a plurality of chips has been promoted actively. Normally, the wire boding is used for the electrical connection between chips. This is because the wire bonding has high degree of freedom in layout and is effective for the connection of the plurality of semiconductor chips.

However, in the wire bonding connection, since it is required that a wire led out from one chip is once connected to a mounting board and the wire is then re-connected to another chip, a wire length between chips becomes long. Consequently, an inductance between chips is increased, and the high-speed transmission becomes difficult. For the issues in the wire bonding connection, a Si (silicon) through-hole electrode technique in which an electrode penetrating through the chip is formed to directly connect the chips has been suggested.

Japanese Patent Application Laid-Open Publication No. 2000-260934 (Patent Document 1) discloses such a technique that electrodes obtained by burying solder or low melting point metal into the through-hole portions formed inside the chips by the electrolytic or electroless plating method are provided on upper and lower portions of the chips, and the chips are stacked and then heated, so that the chips are three-dimensionally stacked by the fusion bonding of the buried electrodes.

Also, Japanese Patent Application Laid-Open Publication No. 2007-053149 (Patent Document 2) discloses such a technique that a stud bump formed in an upper chip is deformed and injected into a hollow through-hole electrode formed in a lower chip by pressure welding, and the stud bump and the through-hole electrode are geometrically caulked, so that the chips are stacked.

SUMMARY OF THE INVENTION

When the through-hole electrode is formed in a semiconductor substrate configuring the chip in view of the stacking of chips, electrode materials are provided on an inner surface of the hole penetrating through the semiconductor substrate and in the periphery of the hole on a rear surface side of the semiconductor substrate in order to ensure a conductive path. Note that, in the present application, the electrode material provided on the side surface of the hole is an inner electrode, and the electrode material provided in the periphery of the hole is a rear-surface wiring pad.

When the through-hole electrode is formed by using the technique disclosed in Japanese Patent Application Laid-Open Publication No. 2007-053149 (Patent Document 2), since the rear-surface wiring pad is formed outer than the rear surface of the semiconductor substrate, that is, on the rear surface of the semiconductor substrate, a convex portion caused by the rear-surface wiring pad is provided on the rear surface of the semiconductor substrate. The inventors of the present invention have found that air leakage is caused by the convex portion when the chip is sucked and this causes a reduction of a sucking force. Therefore, it is considered that a manufacturing yield of the semiconductor device is reduced.

For its solution, the inventors of the present invention have studied as follows. FIG. 1 is a schematic plan view of a rear surface of a chip 1C which the inventors have studied. Note that hatching is attached in a part of FIG. 1 for easily understanding its configuration.

A plurality of through-hole electrodes 4 are provided in a semiconductor substrate 1 configuring the chip 1C, and a planar shape of each through-hole electrode is shown by a circular shape. A rear-surface wiring pad 4d is provided in the periphery of the through-hole electrode 4 on a rear surface of the semiconductor substrate 1, and it is electrically connected to the through-hole electrode 4. Also, a rear-surface wire 4e is provided on the rear surface of the semiconductor substrate 1 so as to electrically connect between the rear-surface wiring pads 4d. Note that the rear-surface wiring pad 4d and the rear-surface wire 4e are made of the same electrode material, and they are formed at the same time from the viewpoint of process efficiency.

When the rear-surface wiring pad 4d and the rear-surface wire 4e are provided on the rear surface of the semiconductor substrate 1 in this manner, the convex portion is provided on the rear surface of the semiconductor substrate 1 as described above, and therefore, air leakage is caused when the chip 1C is sucked and the reduction of the sucking force is caused.

Accordingly, dummy rear-surface wiring pads 4f are formed in a region where the rear-surface wiring pad 4d and the rear-surface wire 4e are not provided on the rear surface of the chip 1C and a frame-shaped dummy rear-surface wire 4g is formed in a peripheral region on the rear surface of the chip 1C to arrange dummy rear-surface wiring pads on the whole rear surface of the chip. By this means, it is considered that the convex portion can be eliminated and the air leakage can be prevented.

However, in the method of providing the rear-surface wiring pad 4d, the rear-surface wire 4e, the dummy rear-surface wiring pad 4f, and the dummy rear-surface wire 4g, for example, when an electrode material such as Au (gold) is used, Au is arranged on the whole rear surface of the chip 1C, and therefore, there is a problem of the increase in the manufacturing cost of the through-hole electrode 4. Further, there is also a problem that the thin and long pattern with the frame shape is likely to peel.

An object of the present invention is to provide a technique capable of improving the manufacturing yield of the semiconductor device.

Another object of the present invention is to provide a technique capable of reducing the manufacturing cost of the semiconductor device.

The above and other objects and novel characteristics of the present invention will be apparent from the description of the present specification and the accompanying drawings.

The typical ones of the inventions disclosed in the present application will be briefly described as follows.

A concave portion is provided so as to be wider than the patterns of a rear-surface wiring pad and a rear-surface wire on a rear surface side of a semiconductor substrate, and the rear-surface wiring pad and the rear-surface wire are provided inside the concave portion.

The effects obtained by typical aspects of the present invention disclosed in the present application will be briefly described below.

A manufacturing yield of a semiconductor device can be improved.

Also, a manufacturing cost of the semiconductor device can be reduced.

BRIEF DESCRIPTIONS OF THE DRAWINGS

DESCRIPTIONS OF THE PREFERRED EMBODIMENTS

Figure 1:
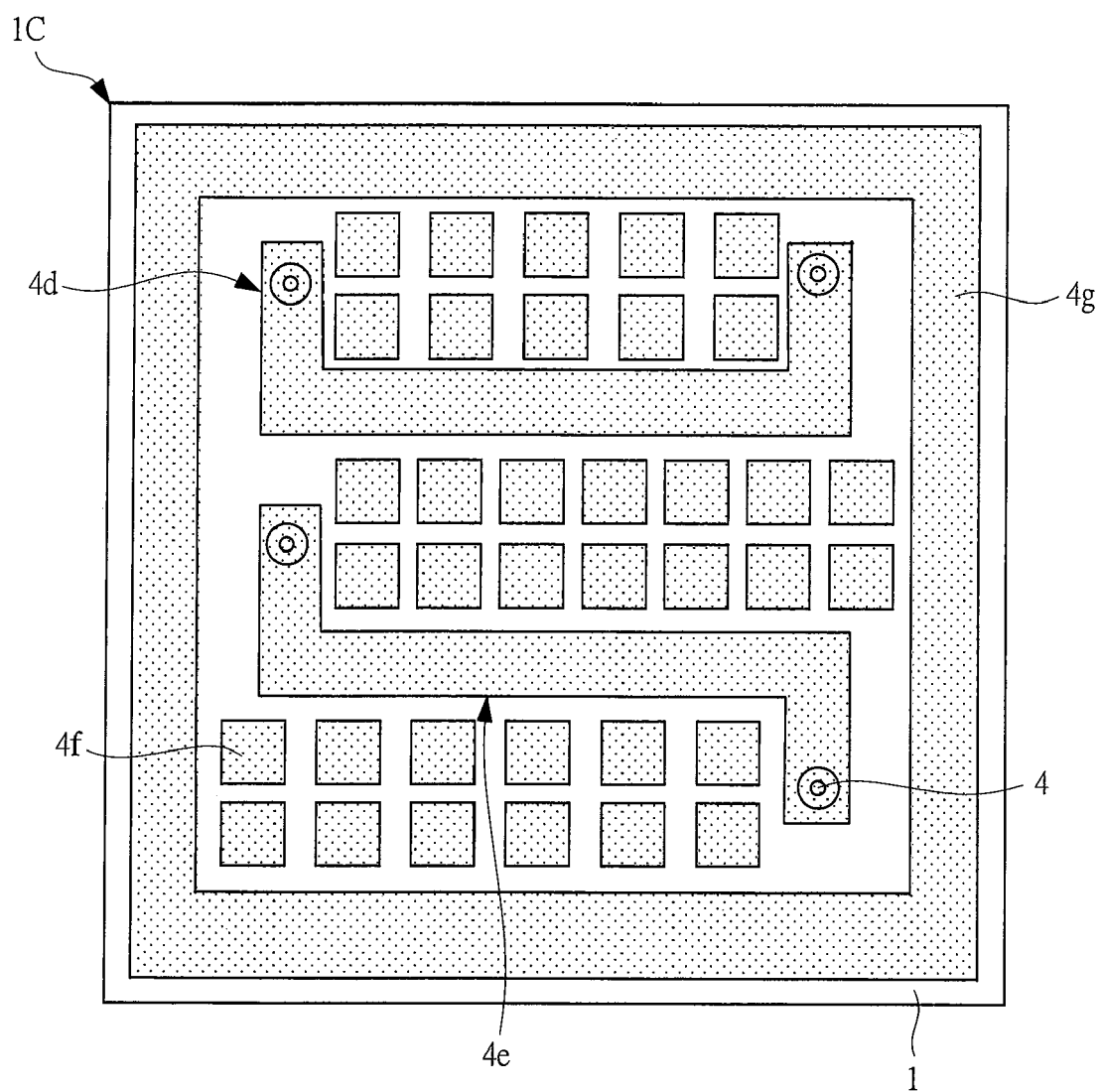
FIG. 1 is a schematic plan view of a rear surface of a semiconductor chip which the inventors of the present invention have studied.

As a method of preventing the reduction of a sucking force of a chip without forming a frame and the like in a peripheral region of a rear surface of the chip and arranging a dummy rear-surface wiring pad and a dummy rear-surface wire on the whole rear surface of the chip, the following technique is considered.

First, in a semiconductor wafer (wafer-like semiconductor substrate) having a semiconductor element formed on its main surface (first surface) to be an element-forming surface, a resist mask (first resist mask) for forming a concave portion is formed on a rear surface (second surface) which is located on an opposite side to the main surface. By the dry etching using this resist mask, the concave portion having a depth equal to or larger than a thickness of a rear-surface wiring pad formed in a later step is formed.

And then, a resist mask (second resist mask) for opening a hole is formed at a position inside the concave portion corresponding to a main-surface wiring pad (first conductive film) electrically connected to the semiconductor element on the main surface. A hole (first hole) reaching an interlayer insulating film on a surface of the semiconductor wafer is formed by the dry etching with using this resist mask, and then, after a process gas is changed, the hole (first hole) is formed further in the interlayer insulating film at least between the main-surface wiring pad and a boundary between silicon of the semiconductor wafer and the interlayer insulating film.

The wafer is rinsed after the etching, and an insulating film is formed on an inner surface of the hole and on the rear surface of the semiconductor wafer by CVD method. Then, an Al (aluminum) film is formed for protecting the insulating film. A resist mask (third resist mask) having the opening portion in a part of a bottom surface of the hole is formed by the photolithography technique, and the Al film and the insulating film on the bottom surface of the hole and the interlayer insulating film on the bottom surface of the hole are processed by etching, so that a contact hole (second hole) reaching an electrode on the surface of the semiconductor wafer is formed.

A metal seed layer is formed on the rear surface of the semiconductor wafer including inner surfaces and bottom surfaces of the concave portion, the hole, and the contact hole, and a resist mask (fourth resist mask) for plating to form the rear-surface wire and the rear-surface wiring pad is formed on the formed metal seed layer by the photolithography technique, and then, a plating layer is formed by the plating method. After removing the resist mask for plating, a cover of a resist mask (fifth resist mask) for protecting is provided on the rear-surface wiring pad and the rear-surface wire, and the metal seed layer is etched, thereby forming the rear-surface wire and the rear-surface wiring pad (second conductive film). At this time, since the concave portion is deeper than the thickness of the rear-surface wiring pad, a surface of the rear-surface wiring pad is positioned inner than the rear surface of the semiconductor substrate. More specifically, the rear-surface wire and the rear-surface wiring pad are placed inside the concave portion.

Figure 2:
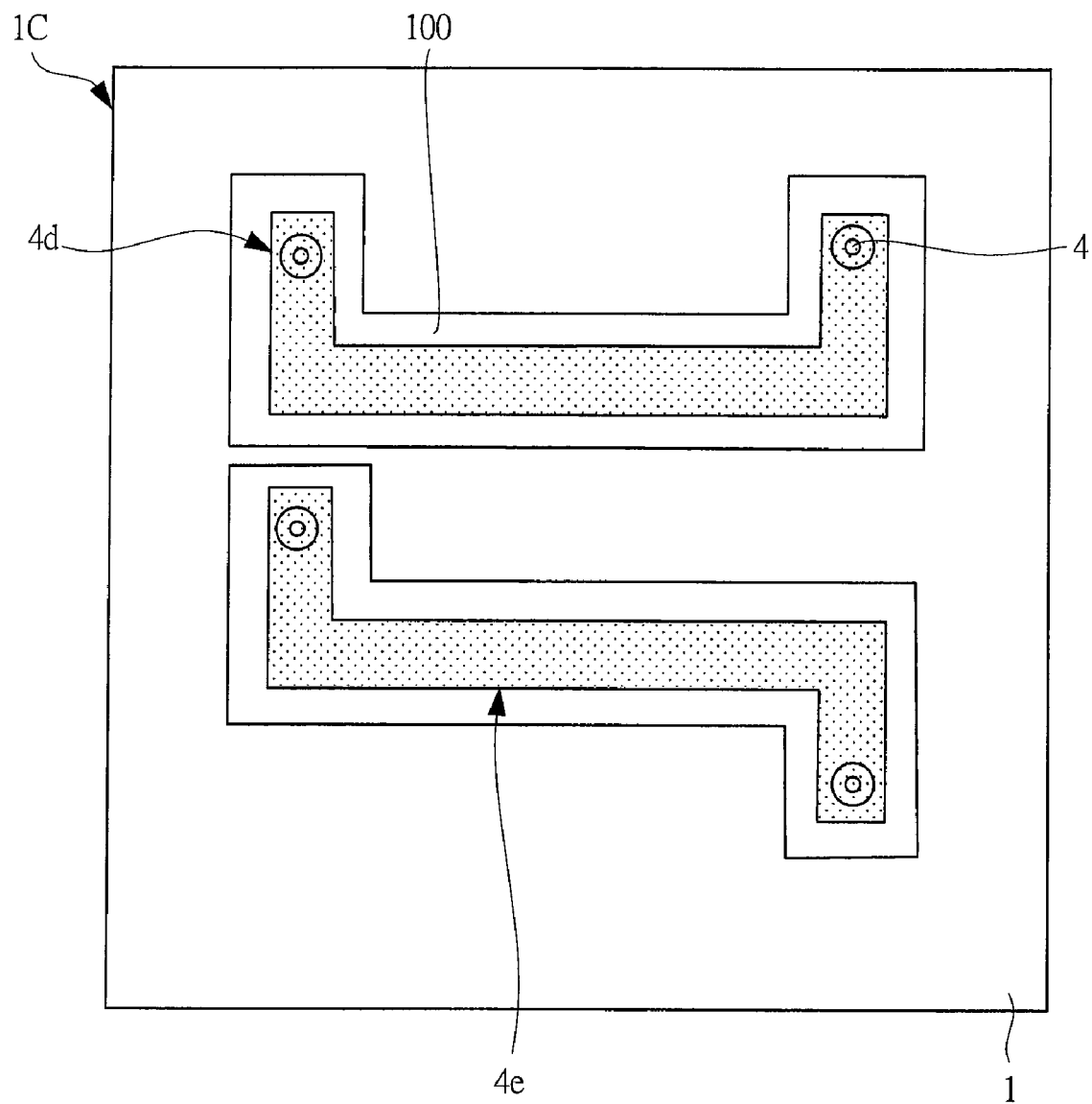
FIG. 2 is a schematic plan view of the rear surface of the semiconductor chip to which the present invention is applied.

FIG. 2 is a schematic plan view of the rear surface of the semiconductor chip to which the present invention is applied. Note that hatching is attached in a part of FIG. 2 for easily understanding the configuration.

As shown in FIG. 2, a concave portion 100 is provided so as to be wider than the patterns of a rear-surface wiring pad 4*d* and a rear-surface wire 4*e*, and the rear-surface wiring pad 4*d* and the rear-surface wire 4*e* are provided inside the concave portion 100, so that the surface of the rear-surface wiring pad is prevented from being formed outer than the rear surface of the semiconductor substrate 1 (chip 1C), thereby preventing the formation of the convex portion on the rear surface of the chip.

If the present invention is applied when the through-hole electrode is formed, it is possible to prevent the formation of the convex portion on the rear surface of the chip, so that the reduction of the sucking force of the chip can be prevented. Also, as compared with a technique of forming a frame of the rear-surface wiring pad and a dummy pattern on the rear surface of the chip, the reduction of the sucking force of the chip can be prevented at low cost.

Hereinafter, embodiments of the present invention will be described in detail with reference to the accompanying drawings. Note that components having the same function are denoted by the same reference symbols throughout the drawings for describing the embodiments, and the repetitive description thereof will be omitted. Also, in the drawings for describing the following embodiments, hatching is sometimes attached even in plan views for easily understanding the configurations.

(First Embodiment)

In the present embodiment, in a semiconductor chip configuring a semiconductor device such as a microcomputer chip, the case where the present invention is applied when a through-hole electrode is provided in the semiconductor chip mounting a highly-integrated circuit (semiconductor element) will be described. Note that the semiconductor chip is provided by cutting off from a wafer-like semiconductor substrate (semiconductor wafer) after forming the semiconductor element on the semiconductor substrate. Also, the through-hole electrode is formed in the semiconductor chip in the wafer state.

Figure 3:
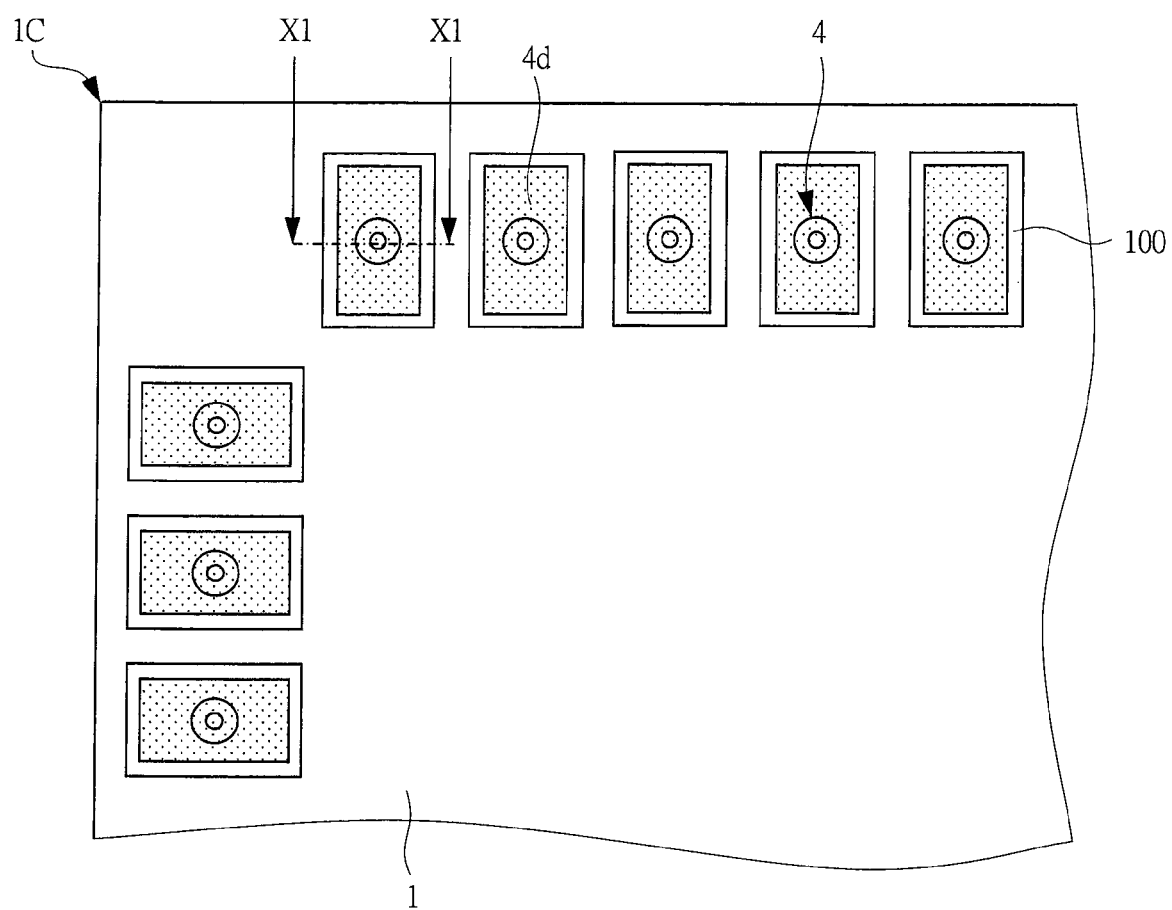
FIG. 3 is a schematic plan view of a principal part of a semiconductor device according to an embodiment of the present invention.
Figure 4:
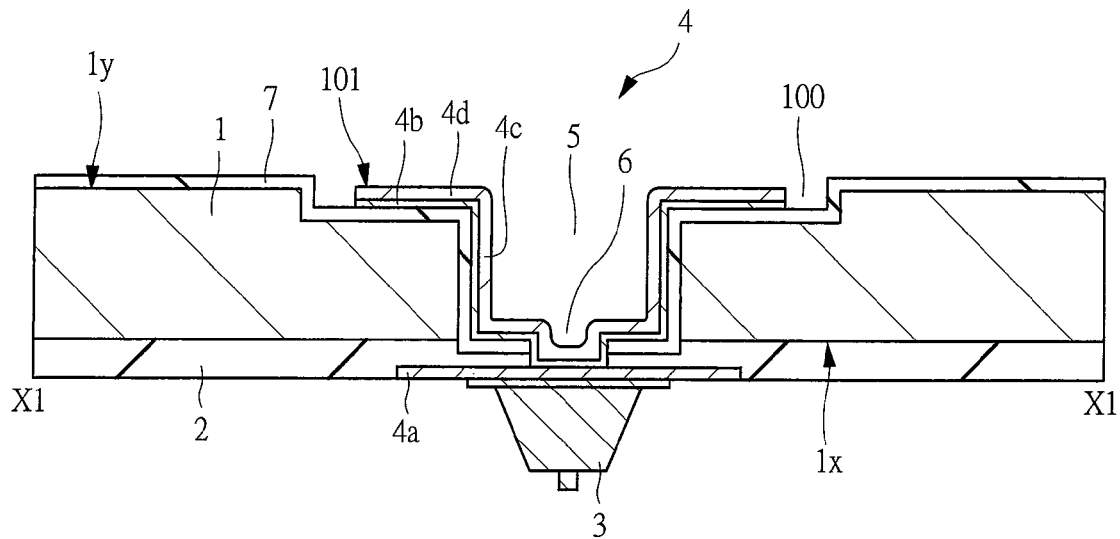
FIG. 4 is a schematic sectional view of the semiconductor device in a line X1-X1 of FIG. 3.

FIG. 3 is a schematic plan view of a principal part of a semiconductor device according to the present embodiment, and FIG. 4 is a schematic sectional view of the semiconductor device in a line X1-X1 of FIG. 3.

As shown in FIG. 4, the semiconductor substrate 1 has a main surface $1x$ and a rear surface $1y$ located on an opposite side of the main surface. A semiconductor element (not shown) is formed on the main surface $1x$ of the semiconductor substrate 1, and an interlayer insulating film 2 is formed on the main surface $1x$ of the semiconductor substrate 1 so as to cover the semiconductor element. A main-surface wiring pad $4a$ is formed on a topmost surface of the interlayer insulating film 2 and is provided via the interlayer insulating film 2 on the main surface $1x$ of the semiconductor substrate 1. A stud bump (bump electrode) 3 is formed on the main-surface wiring pad $4a$.

Also, the concave portion 100 is formed on the rear surface $1y$ side of the semiconductor substrate 1. A hole 5 reaching a portion between a surface of the interlayer insulating film 2 and the main-surface wiring pad $4a$ is formed so as to penetrate through an inside of the semiconductor substrate 1 from a bottom surface of the concave portion 100, and a contact hole 6 having a hole diameter smaller than that of the hole 5 is formed from the bottom surface of the hole 5 to the main-surface wiring pad $4a$ so as to penetrate through an inside of the interlayer insulating film 2.

Further, an insulating film 7 is formed on the rear surface $1y$ of the semiconductor substrate 1 including the bottom surfaces and side surfaces of the hole 5 and the concave portion 100. Since a stacked film (conductive film) of a metal seed layer $4b$ and an Au film (configuring an inner electrode $4c$ and a rear-surface wiring pad $4d$) is configured along the concave portion 100 and the hole 5 via the insulating film 7 and along the contact hole 6, the main-surface wiring pad $4a$, the metal seed layer $4b$, the inner electrode $4c$, and the rear-surface wiring pad $4d$ are electrically connected to each other. Note that, although the Au film used in the present embodiment is a plating layer formed by the plating method, the film may be not only the Au film but also an Au/Ni stacked film and the like.

Accordingly, a through-hole electrode 4 of the semiconductor device according to the present embodiment has a hole penetrating through the semiconductor substrate 1, and the hole includes: the hole 5 which is a hole reaching the interlayer insulating film 2 from the bottom surface of the concave portion 100 and whose bottom surface is located at a position closer to the main-surface wiring pad $4a$ than the boundary between the interlayer insulating film 2 and the semiconductor substrate 1; and the contact hole 6 which is a hole reaching the main-surface wiring pad $4a$ from the bottom surface of the hole 5 and whose hole diameter is smaller than that of the hole 5. Further, the through-hole electrode 4 includes: the insulating film 7 formed on the bottom surface and side surface of the hole 5 and on the bottom surface of the concave portion 100; the rear-surface wiring pad $4d$ formed on the bottom surface and side surface of the hole 5 and on the bottom surface of the concave portion 100 via the insulating film 7 and formed on the bottom surface of the contact hole 6 so as to be electrically connected to the main-surface wiring pad $4a$; the metal seed layer $4b$; and the inner electrode $4c$.

The through-hole electrode 4 is covered by the insulating film 7 and the interlayer insulating film 2, and is electrically insulated from the semiconductor substrate 1. Also, the rear-surface wiring pad $4d$ is formed inside the concave portion 100, and a main surface 101 of the rear-surface wiring pad is positioned inner than the rear surface $1y$ of the semiconductor substrate. Further, as shown in FIG. 3, the planar shape of the concave portion 100 is not limited to the illustrated shape (rectangular shape) as long as the concave portion 100 is larger than the rear-surface wiring pad $4d$ in a plan view.

As described above, by providing the concave portion 100 wider than the pattern of the rear-surface wiring pad $4d$ and providing the rear-surface wiring pad $4d$ inside the concave portion 100, the main surface 101 of the rear-surface wiring pad $4d$ can be prevented from being formed outer than the rear surface $1y$ of the semiconductor substrate 1. That is, it is possible to prevent the formation of the convex portion on the rear surface $1y$ of the semiconductor substrate 1. Further, since flatness of the rear surface $1y$ of the semiconductor substrate 1 can be ensured, the reduction of the sucking force can be prevented when the substrate is handled as the chip 1C. Accordingly, in the manufacture of the semiconductor device, the manufacturing yield can be improved and the manufacturing cost can be reduced.

Next, the manufacturing method of the semiconductor device shown in FIG. 4, more particularly, the manufacturing method of the through-hole electrode 4 will be described with reference to FIGS. 5 to 29.

Figure 5:
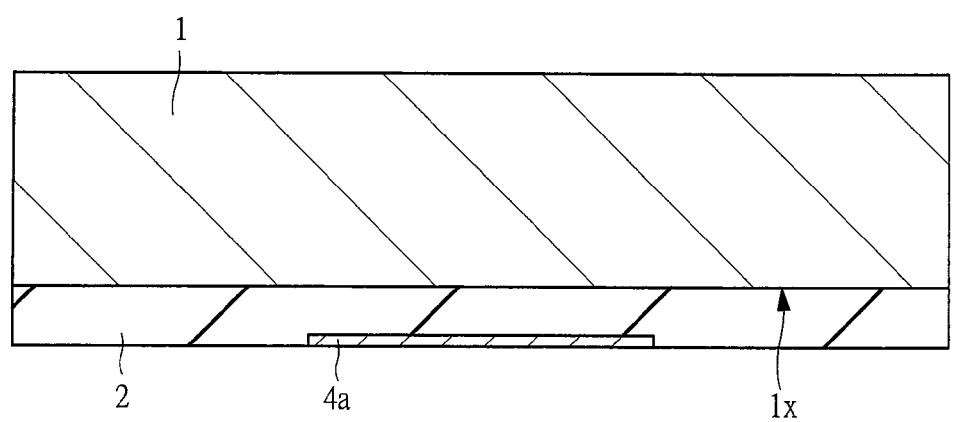
FIG. 5 is a schematic sectional view of a principal part of a semiconductor device in a manufacturing process according to an embodiment of the present invention.

As shown in FIG. 5, the semiconductor substrate 1 made of, for example, single crystal silicon and having a thickness of approximately 10 to 50 μm is prepared. Subsequently, after forming a semiconductor element (not shown) such as a MIS (Metal Insulator Semiconductor) transistor on the main surface (element-forming surface) of the semiconductor substrate 1 by using the well-known technique, the interlayer insulating film 2 formed of, for example, a silicon oxide film and a silicon nitride film is formed on the main surface $1x$ of the semiconductor substrate 1. Subsequently, the main-surface wiring pad $4a$ is formed on a front surface side of the interlayer insulating film 2 via the interlayer insulating film 2 on the main surface $1x$ of the semiconductor substrate 1. The main-surface wiring pad $4a$ is electrically insulated by the interlayer insulating film 2 from the semiconductor element formed on the main surface of the semiconductor substrate 1, and can be formed from, for example, an Al film by using the photolithography method, the sputtering method, and the like.

In the semiconductor substrate 1 in which the through-hole electrode is to be formed, when the thickness thereof is reduced to, for example, approximately 10 to 50 μm, the depth of the through-hole electrode to be formed is reduced, and the process difficulty is decreased. However, such a reduction in thickness causes the reduction of substrate strength and the reduction of manufacturing yield due to the substrate warpage.

Figure 6:
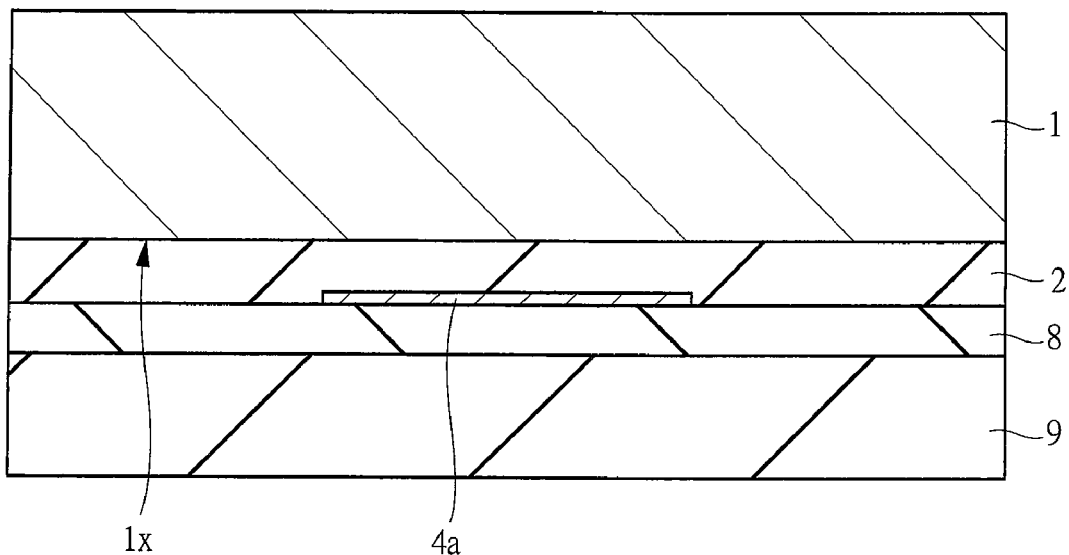
FIG. 6 is a schematic sectional view of the principal part of the semiconductor device in the manufacturing process continued from FIG. 5.

Therefore, as shown in FIG. 6, an adhesive layer 8 is coated on the interlayer insulating film 2, and a supporting substrate 9 made of, for example, quartz, glass, or silicon is stuck on the adhesive layer 8. By sticking the supporting substrate 9, the reduction of the semiconductor wafer strength and the semiconductor wafer warpage after the thickness reduction can be suppressed. Also, the adhesive layer 8 has a function to protect an integrated circuit.

Figure 7:
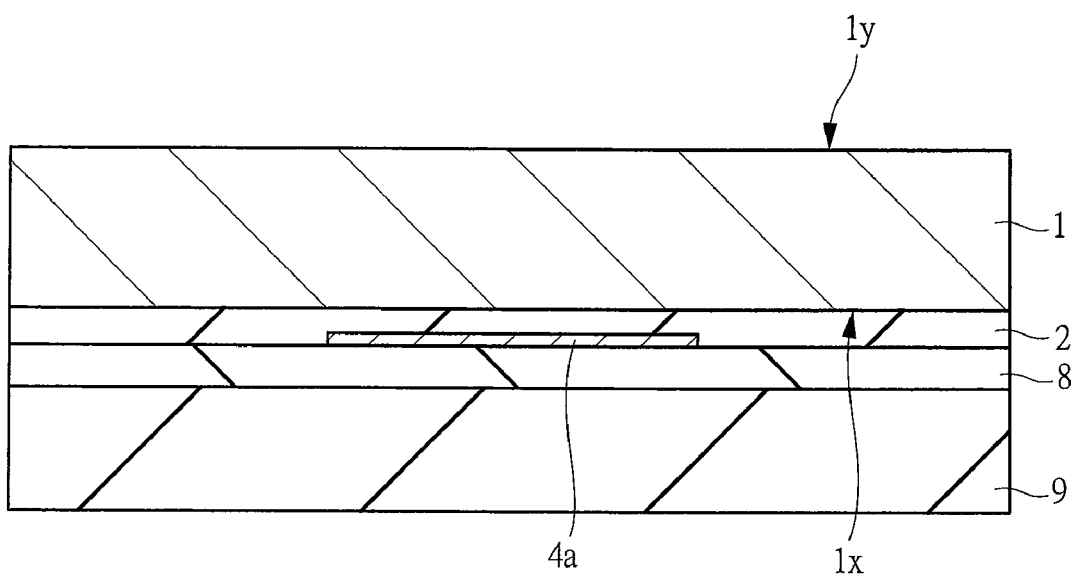
FIG. 7 is a schematic sectional view of the principal part of the semiconductor device in the manufacturing process continued from FIG. 6.

Subsequently, as shown in FIG. 7, back grinding process is performed to thinly grind the thickness of the semiconductor substrate 1. As the grinding method, there are grinding, polishing, and the like. Since the flatness after grinding affects the accuracy of the formation of the rear-surface wiring pad to be formed on the rear surface 1y of the substrate, it is preferable to perform dry polishing, etching, or CMP (Chemical Mechanical Polish).

Figure 8:
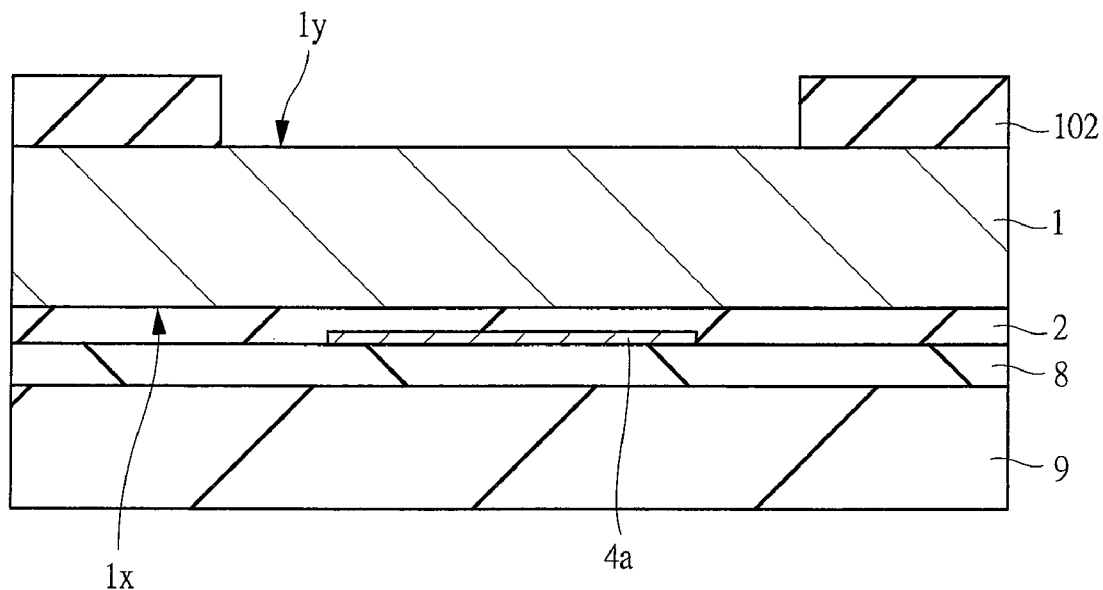
FIG. 8 is a schematic sectional view of the principal part of the semiconductor device in the manufacturing process continued from FIG. 7.

Subsequently, as shown in FIG. 8, a photoresist is coated on the rear surface 1y of the semiconductor substrate 1, and a resist mask 102 for processing the concave portion is formed by the photolithography method. As the resist coating method, for example, the spinner coating is used. Note that a position of the mask formation is determined by confirming a device pattern on the main surface 1x of the semiconductor substrate 1 by the Infrared Spectroscopy method.

Figure 9:
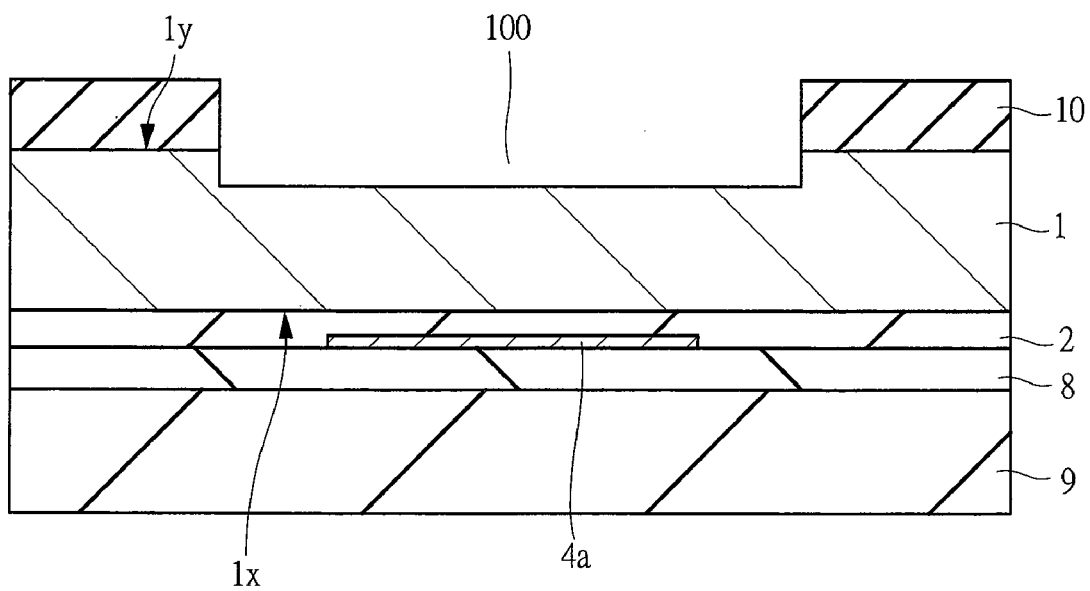
FIG. 9 is a schematic sectional view of the principal part of the semiconductor device in the manufacturing process continued from FIG. 8.

Subsequently, as shown in FIG. 9, the concave portion 100 is formed by etching on the rear surface 1y of the semiconductor substrate 1 with using the resist mask 102 by the dry etching equipment. More specifically, the concave portion 100 is formed by the performing anisotropic etching of the ICP-RIE (Inductively coupled plasma-Reactive ion etching). Note that $SF_6$ and $C_4F_8$ are used as the process gas. A depth of the concave portion 100 is equal to or larger than a thickness (for example, approximately 2 µm) of the rear-surface wiring pad 4d formed in later steps.

Figure 10:
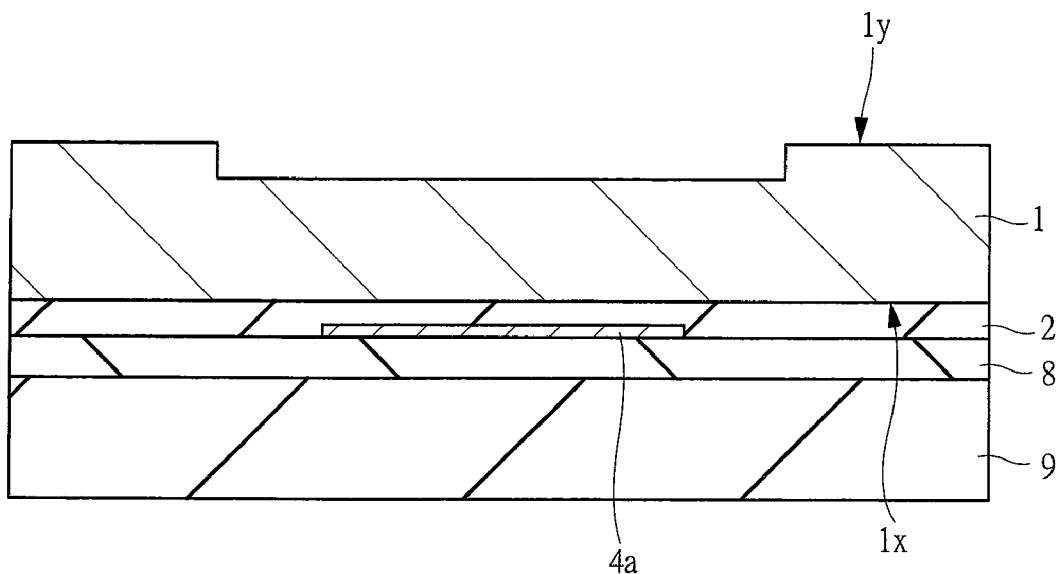
FIG. 10 is a schematic sectional view of the principal part of the semiconductor device in the manufacturing process continued from FIG. 9.

Subsequently, as shown in FIG. 10, the resist mask 102 for processing the concave portion is removed by the organic solvent and oxygen ashing.

Figure 11:
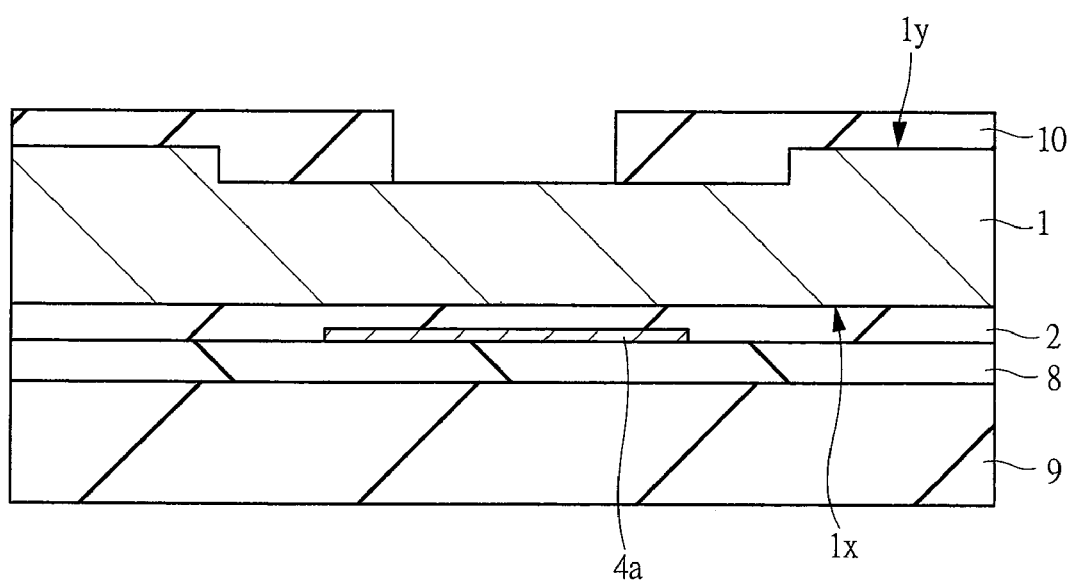
FIG. 11 is a schematic sectional view of the principal part of the semiconductor device in the manufacturing process continued from FIG. 10.

Subsequently, as shown in FIG. 11, a photoresist is coated on the rear surface 1y of the semiconductor substrate 1, and a resist mask 10 for opening the hole is formed by the photolithography method. As the resist coating method, for example, spinner coating is used. Note that a position of the mask formation is determined by, for example, using an alignment mark formed simultaneously with the concave portion 100.

Figure 12:
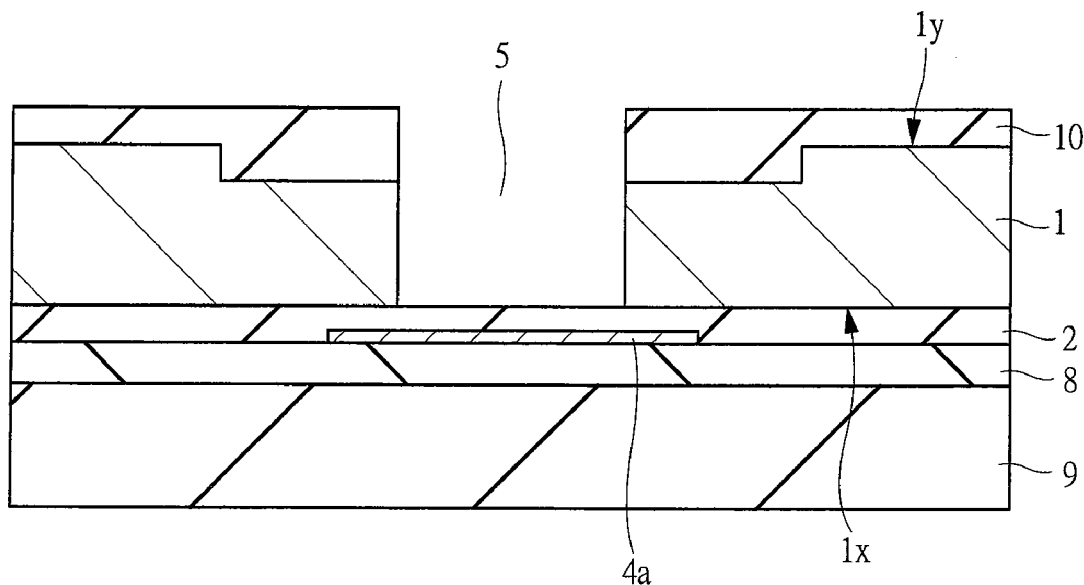
FIG. 12 is a schematic sectional view of the principal part of the semiconductor device in the manufacturing process continued from FIG. 11.

Subsequently, as shown in FIG. 12, the hole 5 is formed by performing the anisotropic etching of the ICP-RIE. Note that $SF_6$ and $C_4F_8$ are used as the process gas. Since silicon is normally etched with using a silicon oxide film as a mask in the dry etching of silicon, the etching by $SF_6$ and $C_4F_8$ stops by the interlayer insulating film 2 mainly made of a silicon oxide film. A depth of the hole 5 at this time is determined by the thickness of the semiconductor substrate 1.

Figure 13:
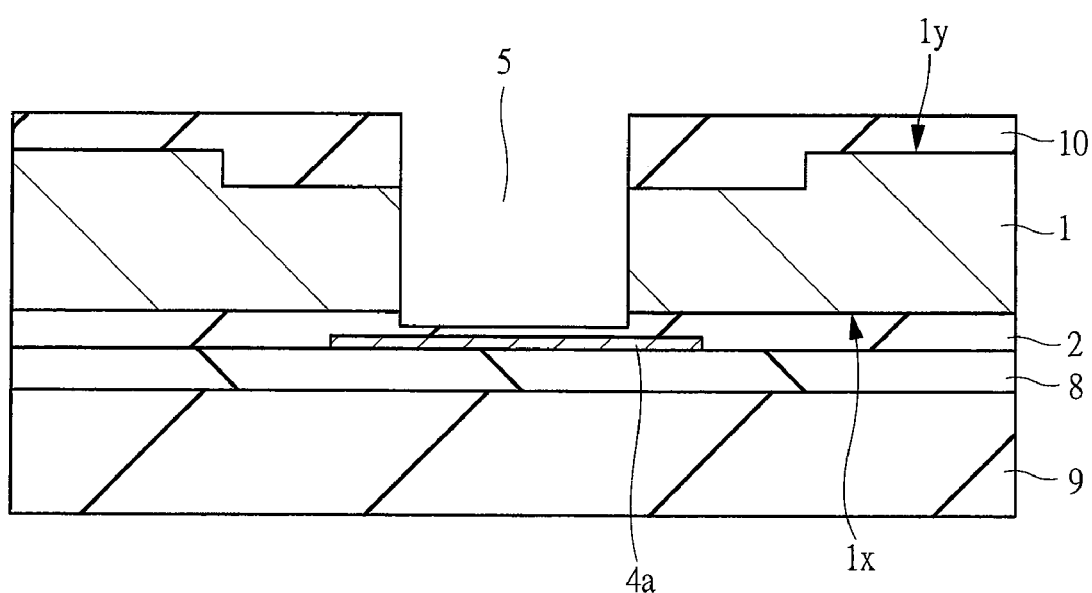
FIG. 13 is a schematic sectional view of the principal part of the semiconductor device in the manufacturing process continued from FIG. 12.

Thereafter, as shown in FIG. 13, after changing the process gas from $SF_6$ and $C_4F_8$ to a mixed gas of $C_3F_8$, Ar, and $CHF_4$, a process of the interlayer insulating film 2 is continued. At this time, no new mask is formed. As a result, the thickness reduction of the interlayer insulating film 2 on the bottom-surface portion of the hole is performed with using the resist mask 10 and the semiconductor substrate 1 (silicon portion) as a mask. And then, the rinsing is performed by the organic solvent and oxygen ashing for removing the resist mask 10 and the like. By this means, the bottom surface of the hole 5 is formed down to a position closer to the main-surface wiring pad 4a than the boundary between the interlayer insulating film 2 and the semiconductor substrate 1.

At this time, the hole 5 reaching the main-surface wiring pad 4a may be formed by continuing the process of the interlayer insulating film 2, but since the interlayer insulating film 2 contacting to the main-surface wiring pad 4a is removed, the strength of the main-surface wiring pad 4a is reduced. Therefore, as described later, the contact hole 6 having a hole diameter smaller than that of the hole 5 formed in the silicon portion is formed in an area reaching the main-surface wiring pad 4a from a lower surface portion of the interlayer insulating film 2.

Figure 14:
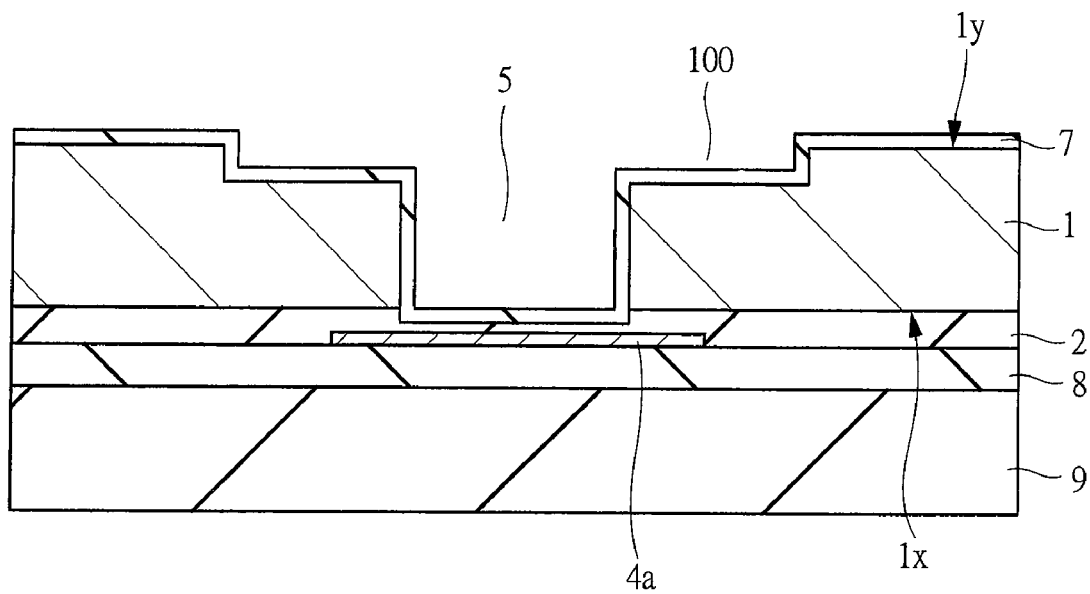
FIG. 14 is a schematic sectional view of the principal part of the semiconductor device in the manufacturing process continued from FIG. 13.

Subsequently, as shown in FIG. 14, the insulating film 7 is formed by, for example, the CVD (Chemical vapor deposition) method on the whole rear surface 1y of the semiconductor substrate 1 including the bottom surface and the side surface of each of the hole 5 and the concave portion 100. The insulating film 7 is formed along an inner wall of the hole 5 and the rear surface 1y of the semiconductor substrate 1 so as to cover these surfaces. As the insulating film 7, silicon oxide, silicon nitride, and polyimide resin can be used.

Figure 15:
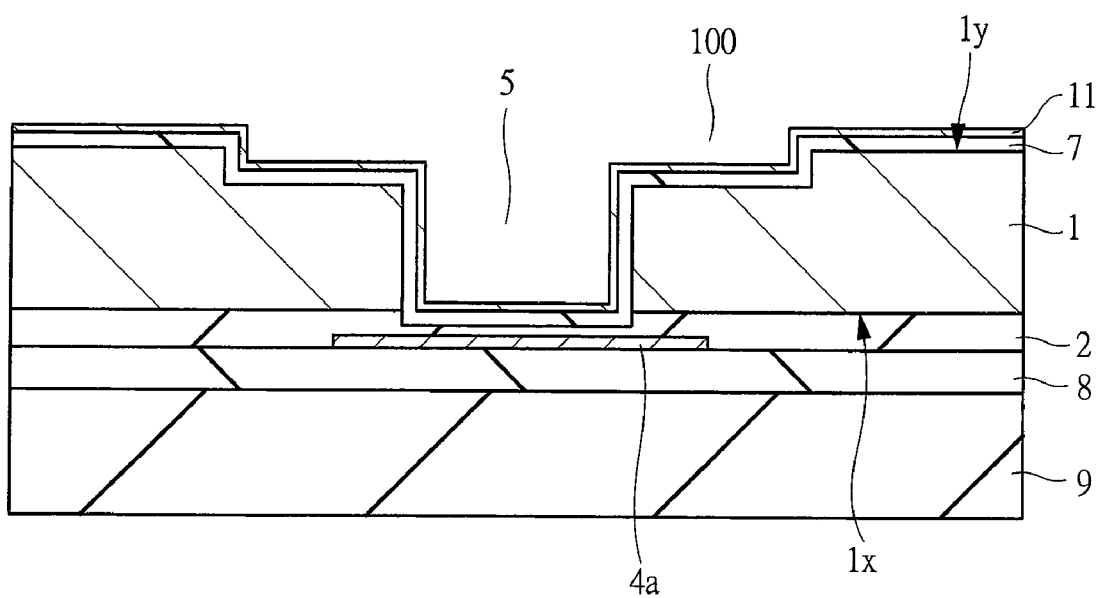
FIG. 15 is a schematic sectional view of the principal part of the semiconductor device in the manufacturing process continued from FIG. 14.

Subsequently, as shown in FIG. 15, an Al (aluminum) film 11 for protecting the insulating film is formed by, for example, the sputtering method so as to cover the insulating film 7 including the inner wall of the hole 5 and the concave portion 100. The forming method thereof may be the vapor deposition.

Figure 16:
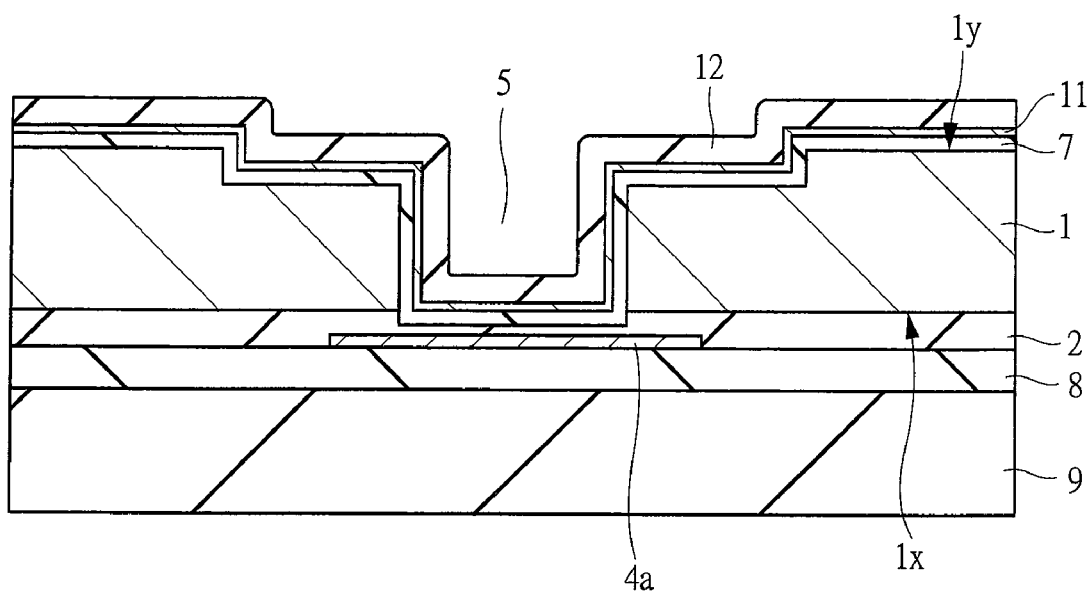
FIG. 16 is a schematic sectional view of the principal part of the semiconductor device in the manufacturing process continued from FIG. 15.

Subsequently, as shown in FIG. 16, a photoresist (resist mask 12) is coated in a region including the inner wall of the hole 5 and the concave portion 100. As a coating method of the resist, for example, there are the coating by a spinner and the coating by a spray. In the case of the spinner coating, it is preferable to use a resist which can be coated to a thickness of 5 to 30 µm for filling the hole 5. Further, if air bubble remains in the resist, exposure process becomes difficult to be performed in the photolithography process, and a pattern defect occurs. Therefore, it is preferable to remove the air bubble by the vacuum defoaming. In the case of the spray coating, the resist can be coated along the hole 5 unlike the case of the spinner coating.

Figure 17:
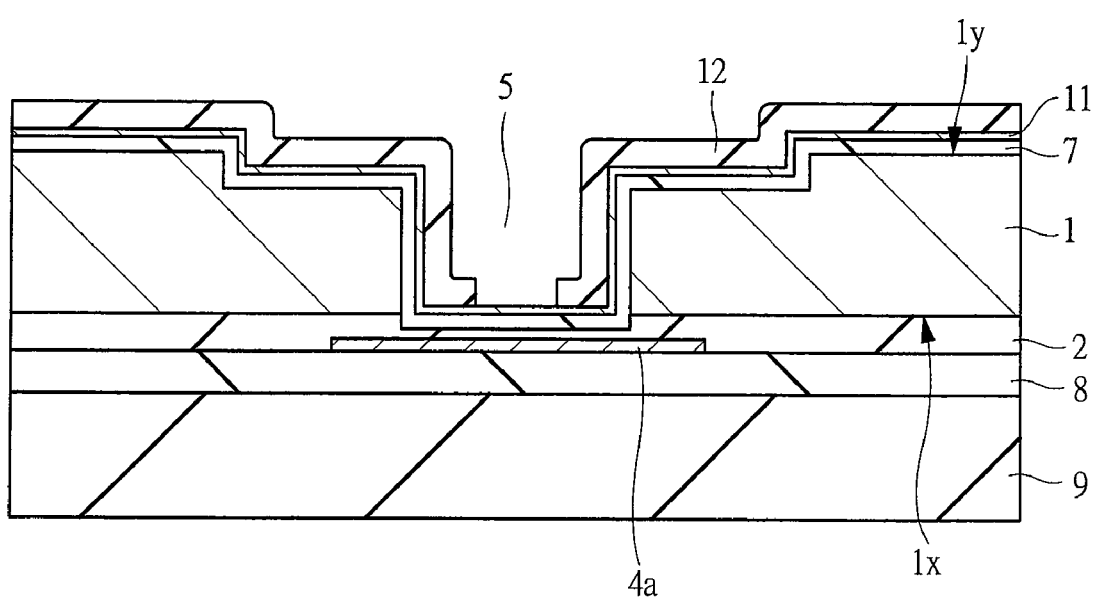
FIG. 17 is a schematic sectional view of the principal part of the semiconductor device in the manufacturing process continued from FIG. 16.

Subsequently, as shown in FIG. 17, the resist coated on the inner wall of the hole 5 is patterned to form the resist mask 12 for opening the contact hole on the bottom surface of the hole 5. In order not to pattern the resist mask 12 for protecting the inner wall of the hole 5, the resist mask 12 is formed to have a small opening diameter. Note that the Al film 11 for protecting the insulating film appears in the opening portion of the resist mask 12.

Figure 18:
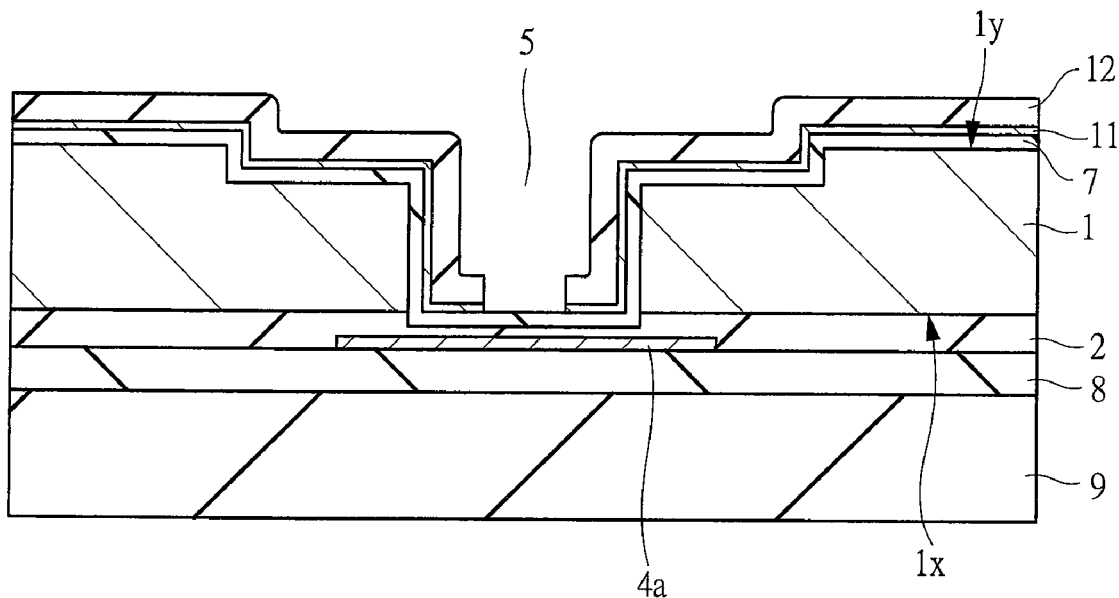
FIG. 18 is a schematic sectional view of the principal part of the semiconductor device in the manufacturing process continued from FIG. 17.

Subsequently, as shown in FIG. 18, the Al film 11 on the opening portion is removed by an etching solution mainly containing phosphoric acid to expose the insulating film 7 in the opening portion. Note that diluted fluoric acid and the like may be also used as the etching solution for Al.

Figure 19:
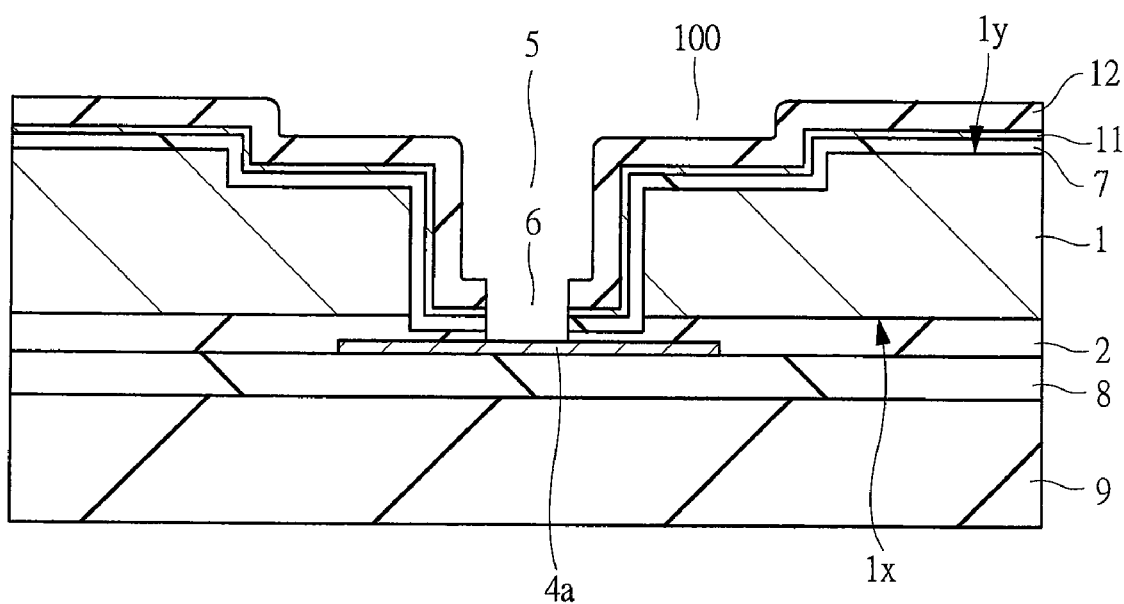
FIG. 19 is a schematic sectional view of the principal part of the semiconductor device in the manufacturing process continued from FIG. 18.

Subsequently, as shown in FIG. 19, residuals of the insulating film 7 and the interlayer insulating film 2 in the opening portion are all processed with using the resist mask 12. By this means, the contact hole 6 in which the main-surface wiring pad 4a is exposed is formed in the opening portion. A mixed gas mainly containing $CHF_3$ and $C_4F_8$ gases is used for the process. In this manner, the hole 5 and the contact hole 6 reaching the main-surface wiring pad 4a are formed on the bottom surface of the concave portion 100.

Figure 20:
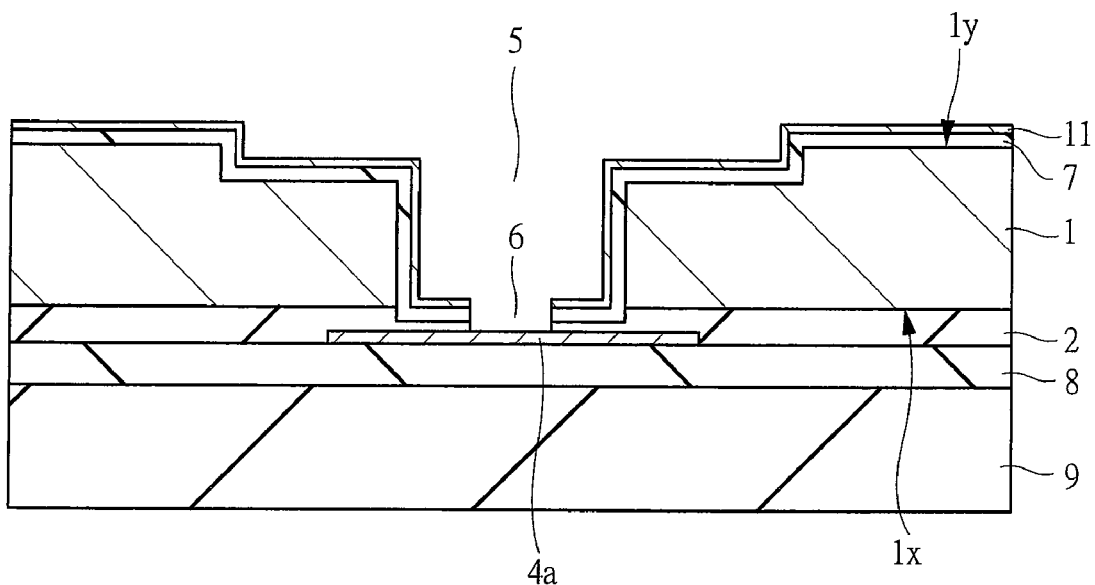
FIG. 20 is a schematic sectional view of the principal part of the semiconductor device in the manufacturing process continued from FIG. 19.
Figure 21:
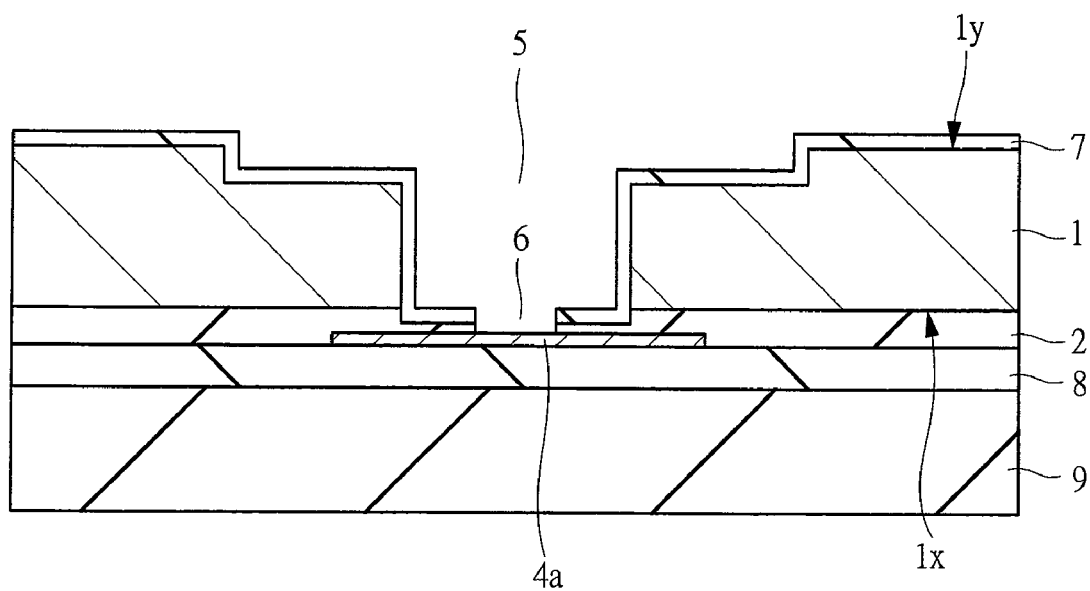
FIG. 21 is a schematic sectional view of the principal part of the semiconductor device in the manufacturing process continued from FIG. 20.

Subsequently, as shown in FIG. 20, the resist mask 12 is removed by the organic solvent and oxygen ashing. Thereafter, as shown in FIG. 21, the Al film 11 for protecting the insulating film is removed by an etching solution for Al. At this time, since the thin main-surface wiring pad 4a is exposed in the opening portion, it is important that the main-surface wiring pad 4a is not solved by the etching solution.

Figure 22:
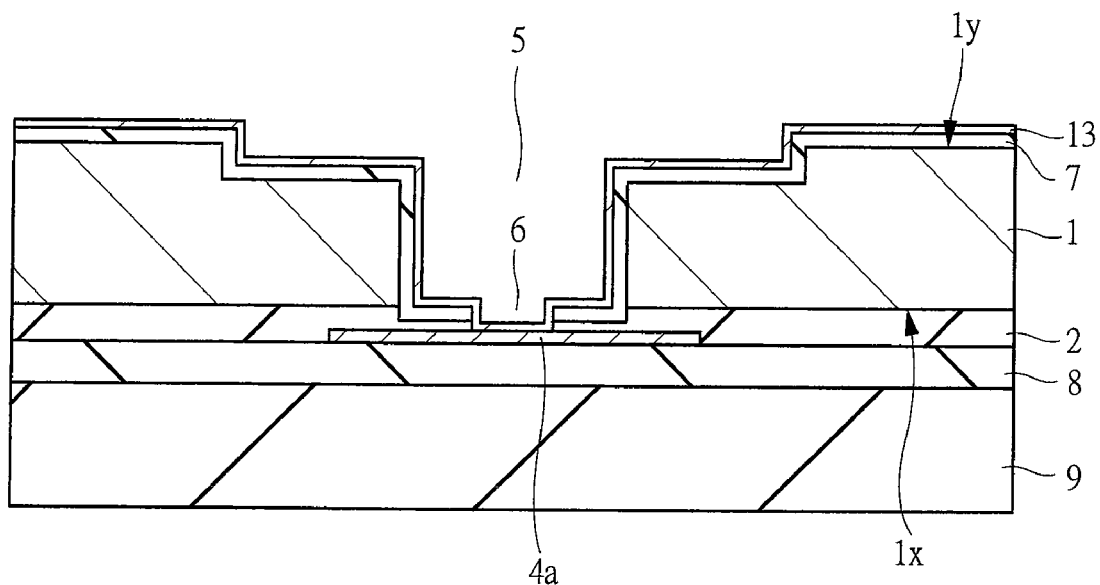
FIG. 22 is a schematic sectional view of the principal part of the semiconductor device in the manufacturing process continued from FIG. 21.

Subsequently, as shown in FIG. 22, a metal seed layer 13 is formed by, for example, the sputtering method on the rear surface 1y (insulating film 7) of the semiconductor substrate 1 including the inside of the hole 5. A stacked film formed of, for example, a Ti (titanium) film and an Au (gold) film is possible as the metal seed layer 13 to be formed. The Ti film is formed to have a thickness of approximately 0.02 µm to 0.3 µm for ensuring an adhesive property between the insulating film 7 and the Au film, and the Au film may have a thickness of approximately 0.3 to 2 µm as the plating seed. As the metal seed layer, for example, a stacked film of a Cr film and an Au film is possible other than the stacked film of a Ti film and an Au film.

Figure 23:
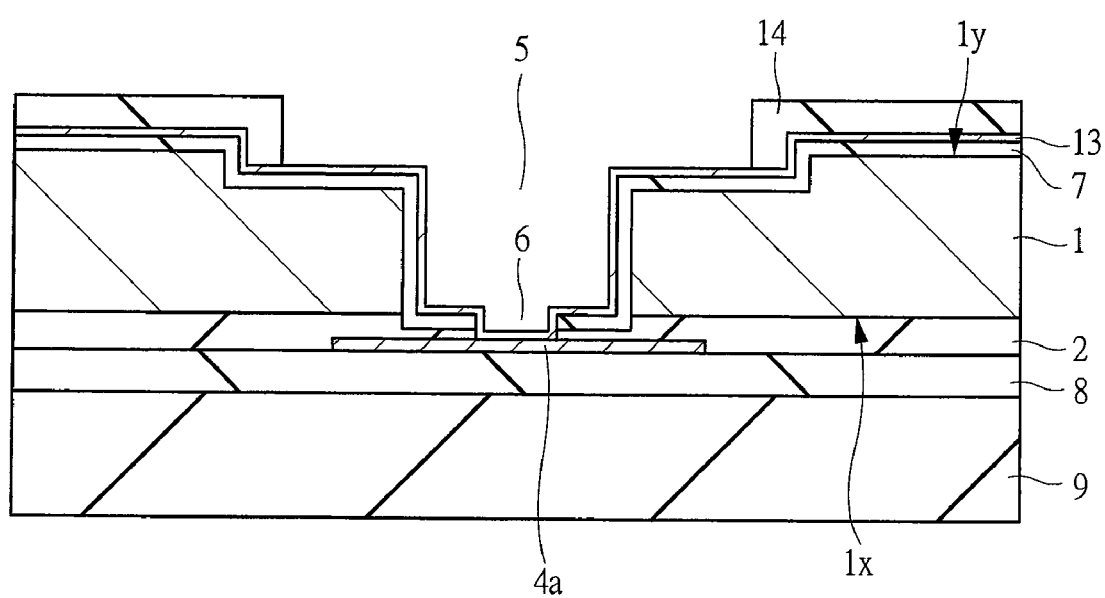
FIG. 23 is a schematic sectional view of the principal part of the semiconductor device in the manufacturing process continued from FIG. 22.

Subsequently, as shown in FIG. 23, a resist mask 14 is formed by the photolithography technique. This resist mask is used in a step of forming a plating film later.

Figure 24:
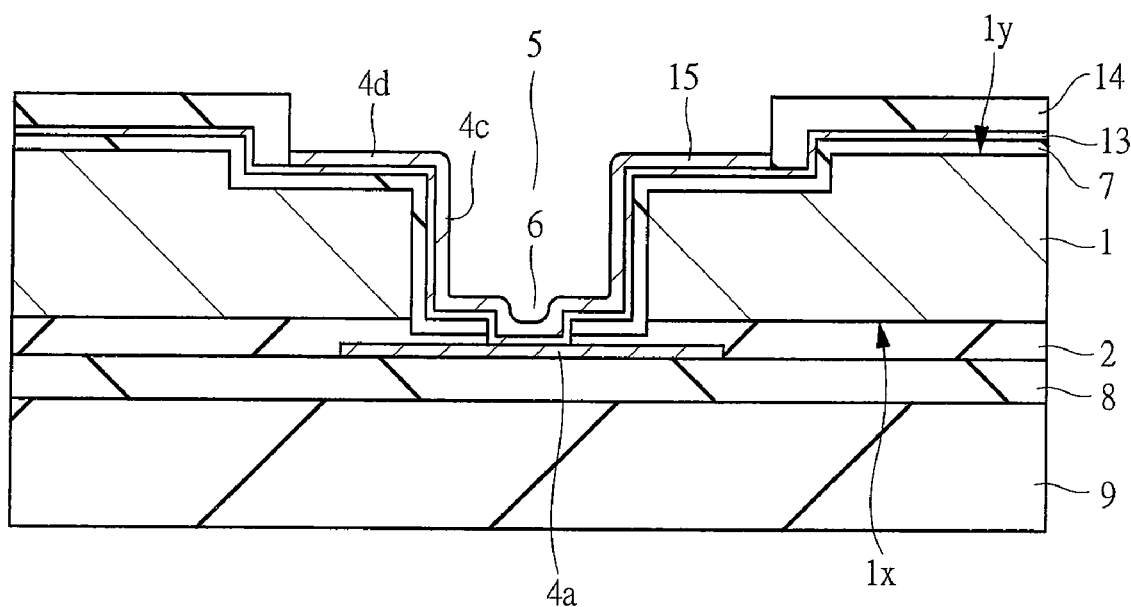
FIG. 24 is a schematic sectional view of the principal part of the semiconductor device in the manufacturing process continued from FIG. 23.

Subsequently, as shown in FIG. 24, the inner electrode 4c and an Au film (plating layer) 15 to be the rear-surface wiring pad 4d are formed by, for example, the electrolytic plating method. Although the thickness of the plating film to be formed is preferably 1 μm or larger in view of the electrical resistance, an inner diameter of the through-hole electrode 4 is adjusted so as to be a predetermined diameter by the thickness of the Au film 15. As a formation method of the Au film 15, the electroless plating method, the sputtering method, and the like are considered. Note that, although a stacked film of an Au film and a Cu film is also possible as the plating film, it is preferable to use an Au film as the topmost surface from the viewpoint of the chip stacking and the wafer stacking.

Figure 25:
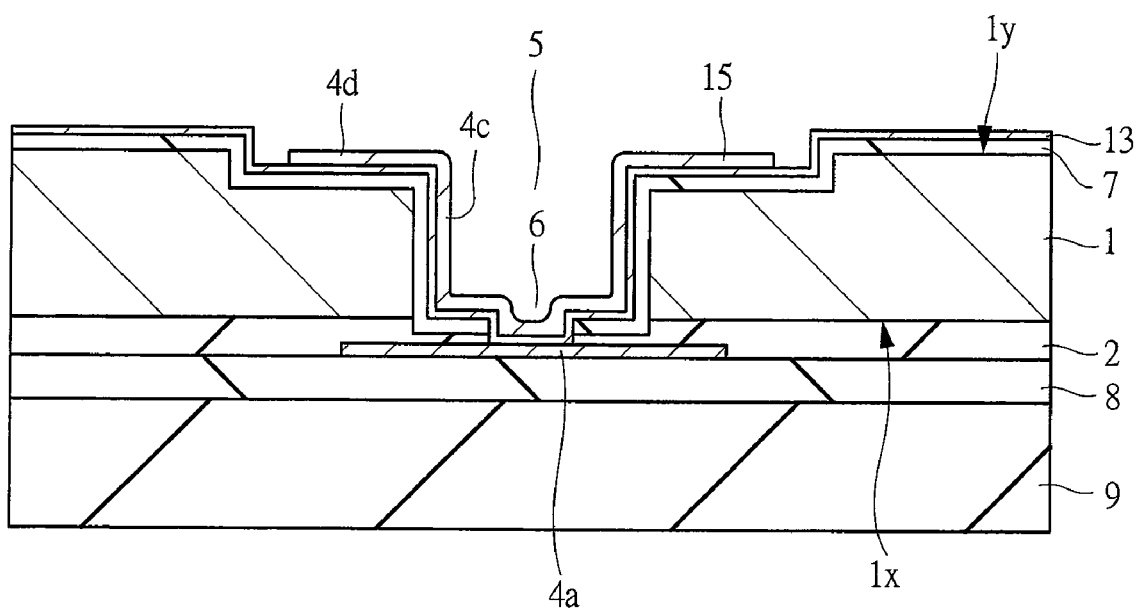
FIG. 25 is a schematic sectional view of the principal part of the semiconductor device in the manufacturing process continued from FIG. 24.
Figure 26:
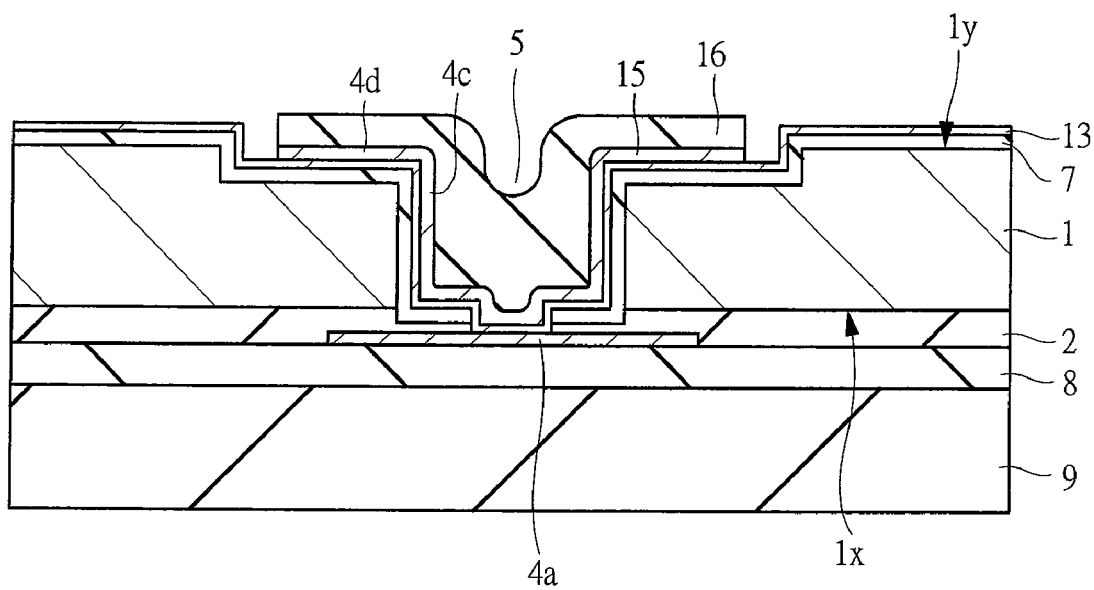
FIG. 26 is a schematic sectional view of the principal part of the semiconductor device in the manufacturing process continued from FIG. 25.

Subsequently, as shown in FIG. 25, the resist mask 14 for plating is removed by the organic solvent and oxygen ashing. And then, as shown in FIG. 26, a resist is patterned by the photolithography process, and a resist mask 16 for protection is formed so as to cover the hole 5 and the rear-surface wiring pad 4d.

Figure 27:
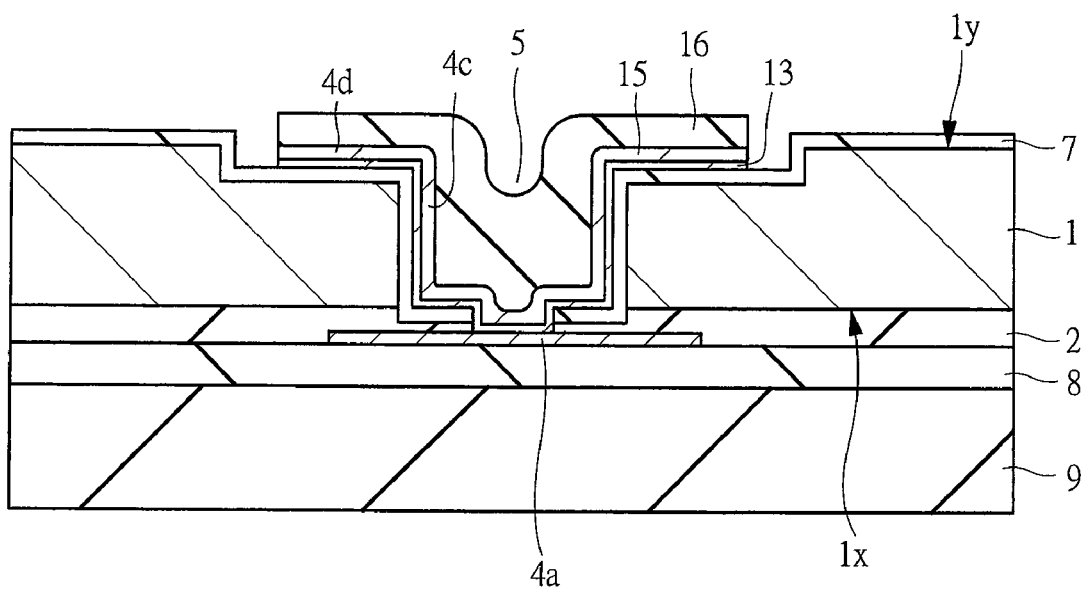
FIG. 27 is a schematic sectional view of the principal part of the semiconductor device in the manufacturing process continued from FIG. 26.

Subsequently, as shown in FIG. 27, the Au film and the Ti film which are the exposed metal seed layer 13 are removed by an etching solution for Au and an etching solution for Ti, respectively. Note that, for example, although fluoric acid is considered as the etching solution for the Ti film, the etching solution may be other etching solution.

In this manner, a conductive film configuring the metal seed layer 4b and the rear-surface wiring pad 4d formed on the bottom surface of the concave portion 100 via the insulating film 7 and electrically connected to the main-surface wiring pad 4a on the bottom surface of the contact hole 6 is formed.

Figure 28:
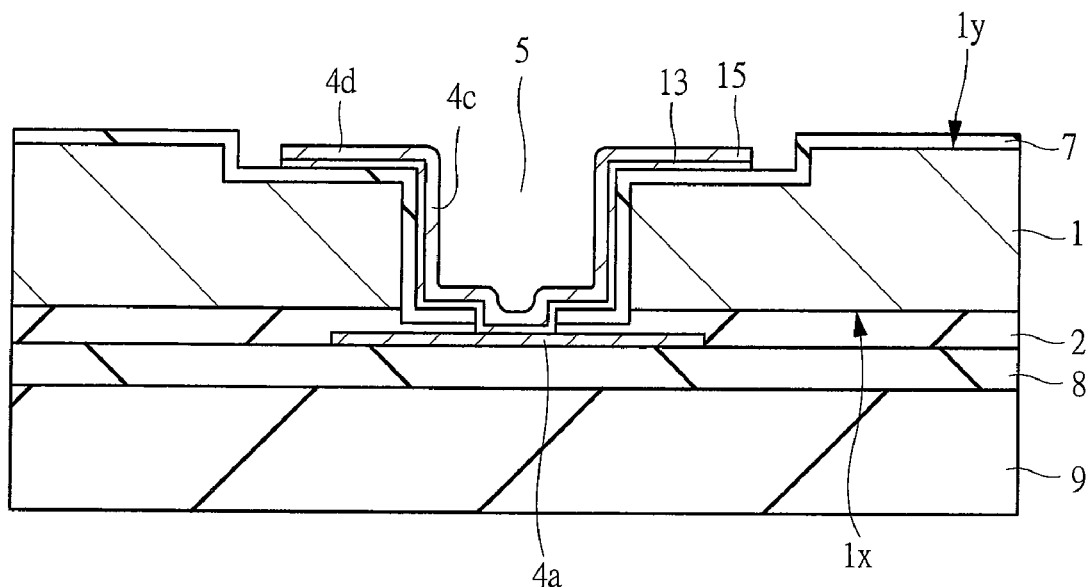
FIG. 28 is a schematic sectional view of the principal part of the semiconductor device in the manufacturing process continued from FIG. 27.
Figure 29:
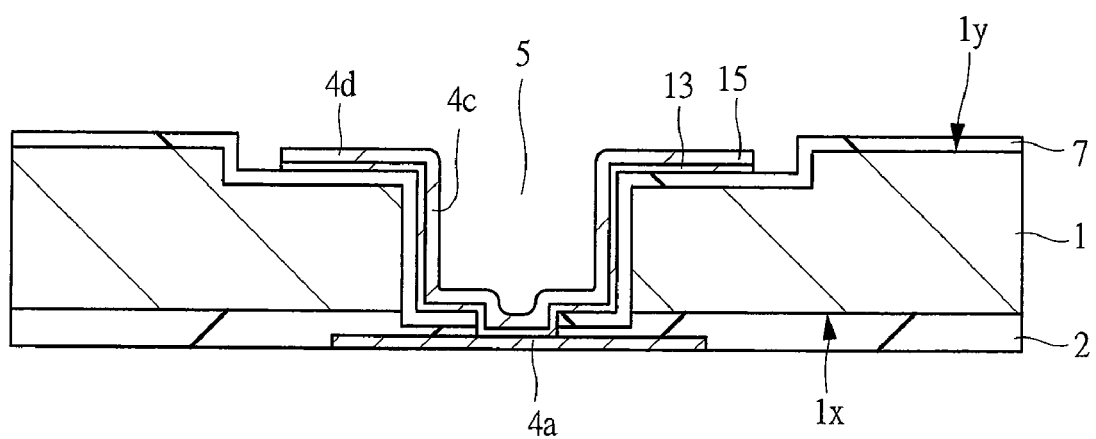
FIG. 29 is a schematic sectional view of the principal part of the semiconductor device in the manufacturing process continued from FIG. 28.

Subsequently, as shown in FIG. 28, the resist mask 16 for protection is removed, thereby completing the process of the semiconductor substrate 1. Thereafter, as shown in FIG. 29, the supporting substrate 9 is peeled off from the semiconductor substrate 1. For example, if the adhesive layer 8 has a thermoplastic property, the peeling off is performed by heating. Next, the wafer-like semiconductor substrate 1 is diced into the chips 1C by the blade dicing. The dicing into the chip can be performed even in a state where the semiconductor substrate 1 is stuck to the supporting substrate 9, but if the supporting substrate 9 is diced together with the semiconductor substrate 1, the supporting substrate 9 cannot be reused. Although the handling thereof becomes difficult, the supporting substrate 9 can be reused when the semiconductor substrate 1 is diced after peeling off from the supporting substrate 9.

Subsequently, as shown in FIG. 4, the bump 3 is formed by, for example, the stud bump method on the main-surface wiring pad 4a on the main surface 1x side of the semiconductor substrate 1. As a forming method of the bump, there are the solder paste bump method, the plating method, the vapor deposition method, and the like.

If the present invention is applied when the through-hole electrode 4 is formed as described above, the formation of the convex portion on the rear surface 1y of the chip 1C (semiconductor substrate 1) can be prevented, so that the reduction of the sucking force of the chip can be prevented. Also, the reduction of the sucking force of the chip can be prevented at low cost as compared with the case of forming the frame-shaped dummy rear-surface wire and dummy rear-surface wiring pad of the rear-surface wiring pad 4d on the rear surface 1y of the chip 1C. Accordingly, in the semiconductor device according to the present embodiment, the manufacturing yield can be improved and the manufacturing cost can be reduced.

(Second Embodiment)

In the present embodiment, in a semiconductor chip configuring a semiconductor device such as a microcomputer chip, the case where the present invention is applied when a plurality of through-hole electrodes adjacent to each other are provided in the semiconductor chip mounting a highly-integrated circuit (semiconductor element) will be described. More specifically, while the case where one through-hole electrode is provided inside one concave portion has been described in the first embodiment, the case where a plurality of through-hole electrodes are provided inside one concave portion will be described in the present embodiment. Note that, since only a point of providing the plurality of through-hole electrodes inside one concave portion is different from the first embodiment, the same descriptions as those of the first embodiment will be omitted.

Figure 30:
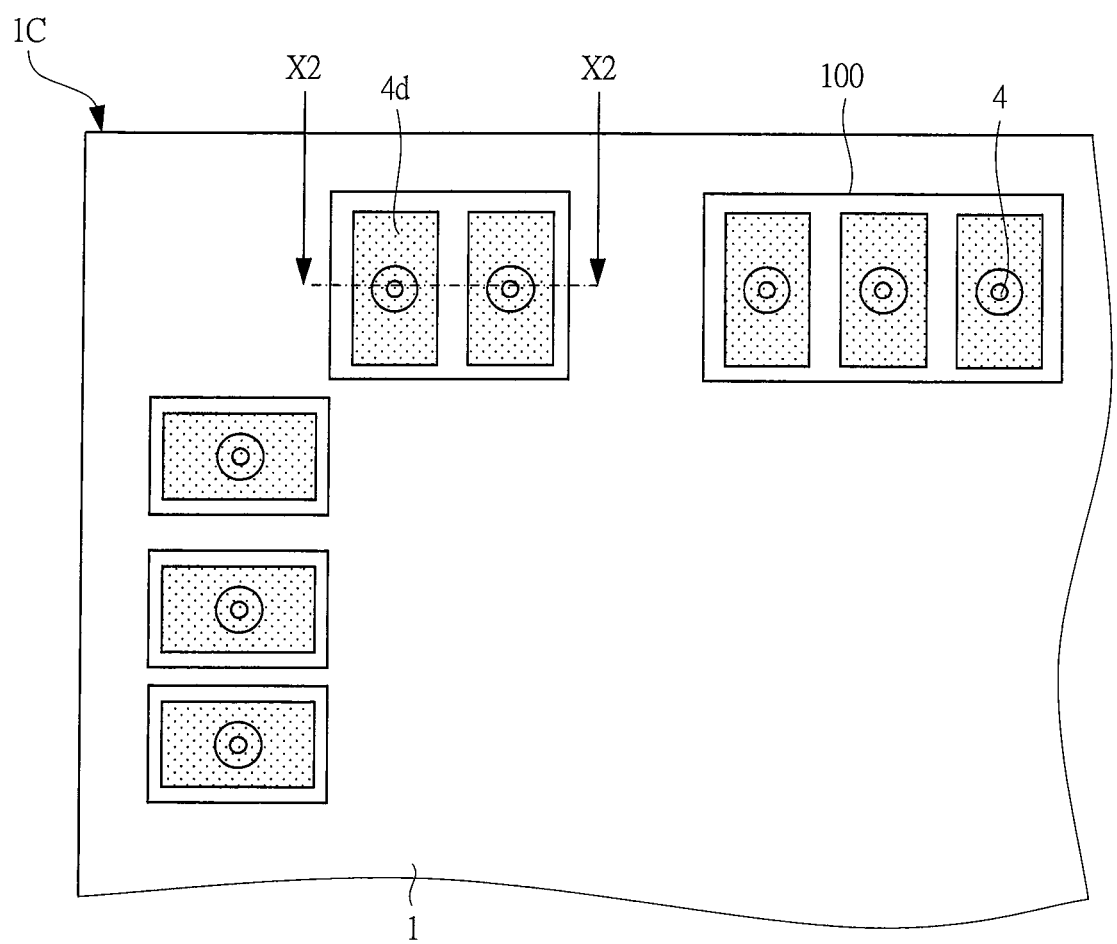
FIG. 30 is a schematic plan view of a principal part of a semiconductor device according to another embodiment of the present invention.
Figure 31:
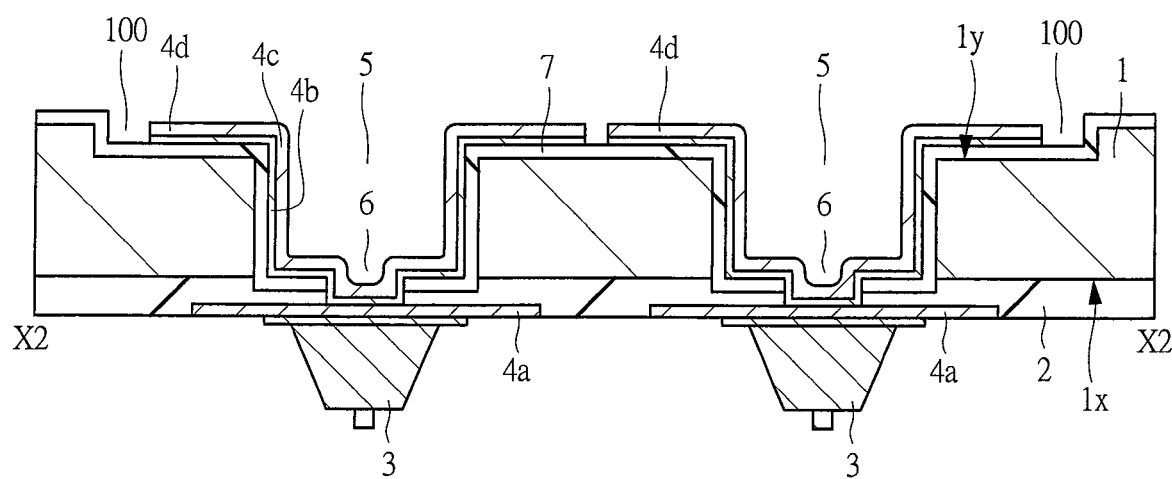
FIG. 31 is a schematic sectional view of the semiconductor device in a line X2-X2 of FIG. 30.

FIG. 30 is a schematic plan view of a principal part of a semiconductor device according to the present embodiment, and FIG. 31 is a schematic sectional view of the semiconductor device in a line X2-X2 of FIG. 30. For example, one to three through-hole electrodes 4 are provided inside the one concave portion 100. When the plurality of the through-hole electrodes 4 are provided on the semiconductor substrate 1, for example, one through-hole electrode 4 can be provided inside the one concave portion 100. However, in view of the requirement for the narrow pitch between the adjacent through-hole electrodes 4, to ensure the pitch between the adjacent concave portions 100 sometimes becomes a hindrance. Accordingly, in the present embodiment, the narrow pitch of the through-hole electrodes 4 is achieved by providing a plurality of through-hole electrodes 4 inside one concave portion 100.

Note that, since the through-hole electrode according to the present embodiment can be formed in the same manner by using the manufacturing method described with reference to FIGS. 5 to 29 in the first embodiment, the description thereof is omitted.

(Third Embodiment)

In the present embodiment, in a semiconductor chip configuring a semiconductor device such as a microcomputer chip, the case where the present invention is applied when a through-hole electrode and a rear-surface wire for wire extension are provided in the semiconductor chip mounting a highly-integrated circuit (semiconductor element) will be described. Note that, since only a point of providing the rear-surface wire for wire extension in addition to the through-hole electrode inside the concave portion is different from the first embodiment, the same descriptions as those of the first embodiment will be omitted.

Figure 32:
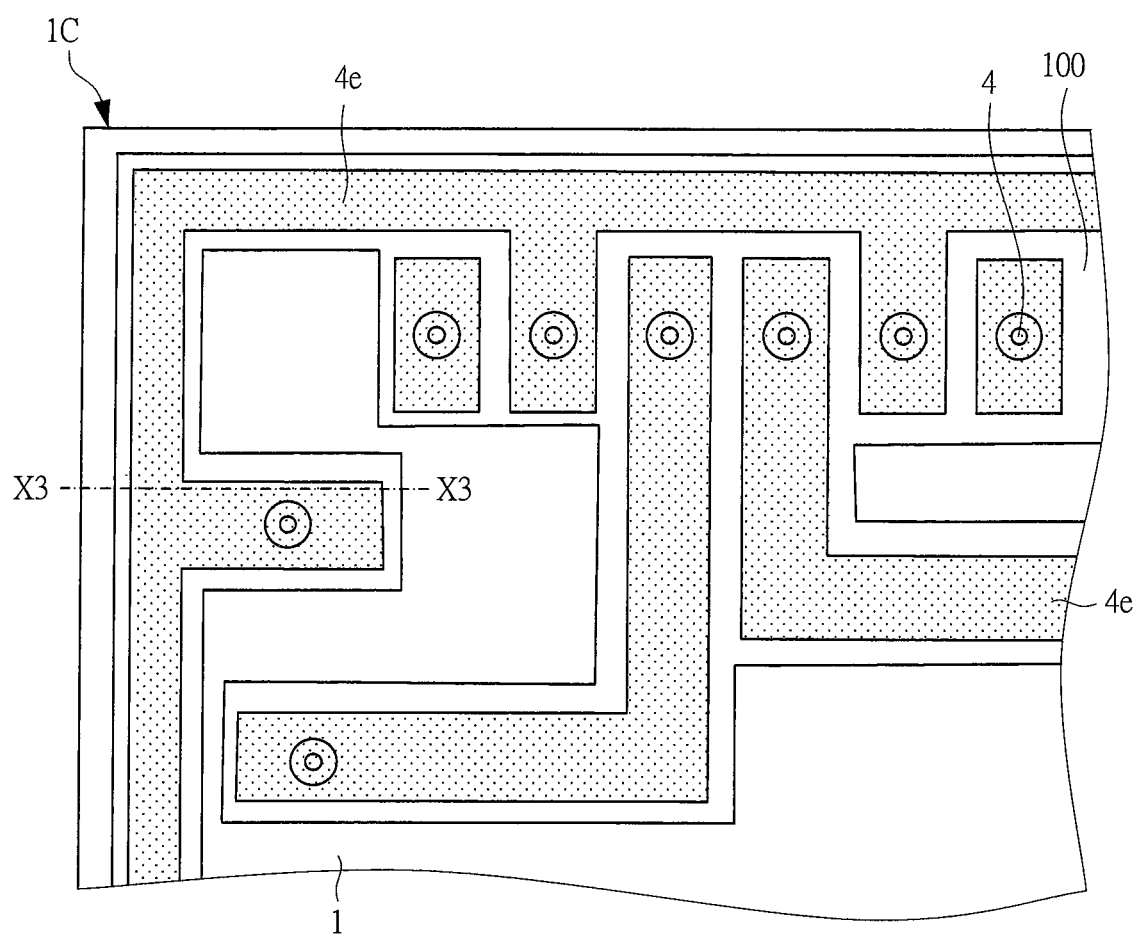
FIG. 32 is a schematic plan view of a principal part of a semiconductor device according to still another embodiment of the present invention.
Figure 33:
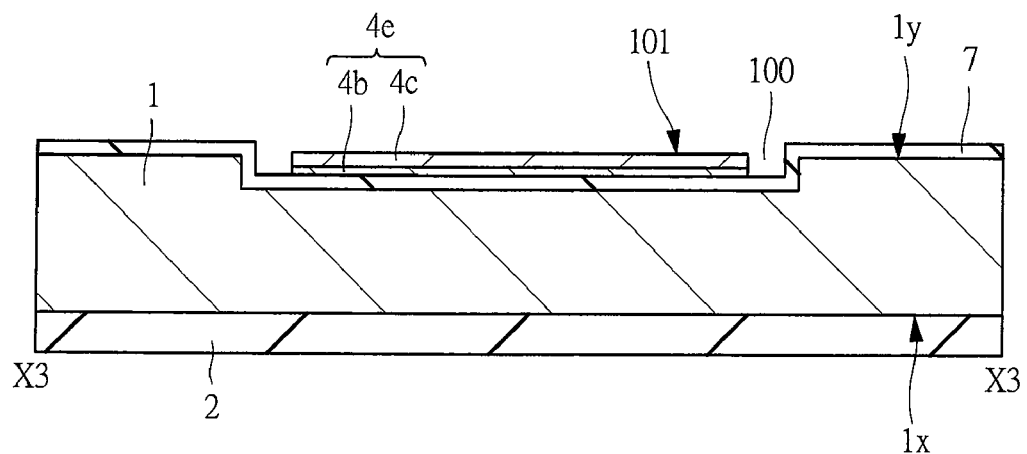
FIG. 33 is a schematic sectional view of the semiconductor device in a line X3-X3 of FIG. 32.

FIG. 32 is a schematic plan view of a principal part of a semiconductor device according to the present embodiment, and FIG. 33 is a schematic sectional view of the semiconductor device in a line X3-X3 of FIG. 32.

As shown in FIG. 33, a semiconductor element (not shown) is formed on the main surface 1x of the semiconductor substrate 1, and the interlayer insulating film 2 is formed so as to cover the semiconductor element. Also, the concave portion 100 is provided on the rear surface 1y of the semiconductor substrate 1, and the rear-surface wire 4e configured of the metal seed layer 4b and the inner electrode 4c is provided inside the concave portion 100. The rear-surface wire 4e is formed inside the concave portion 100, and the main surface 101 of the rear-surface wire 4e is positioned inner than the rear surface 1y of the semiconductor substrate 1. Note that, as shown in FIG. 32, the planar shape of the concave portion 100 is not limited to the illustrated shape as long as the concave portion 100 is larger than the rear-surface wire 4e in a plan view.

As described above, the concave portion 100 is provided so as to be wider than the pattern of the rear-surface wire 4e and the rear-surface wire 4e is provided inside the concave portion 100, so that the main surface 101 of the rear-surface wire 4e can be prevented from being formed outer than the rear surface 1y of the semiconductor substrate 1, and it is possible to prevent the formation of the convex portion on the rear surface 1y of the semiconductor substrate 1. Also, since the flatness of the rear surface 1y of the semiconductor substrate 1 can be ensured, the reduction of the sucking force can be prevented when the substrate is handled as the chip 1C. By this means, in the manufacture of the semiconductor device, the manufacturing yield can be improved and the manufacturing cost can be reduced.

Next, a manufacturing method of the semiconductor device shown in FIG. 33, more particularly, a manufacturing method of the rear-surface wire 4e will be described with reference to FIGS. 34 to 50. Note that the description of FIGS. 5 to 7 which is the same steps as those of the first embodiment is omitted, and the subsequent steps will be described.

Figure 34:
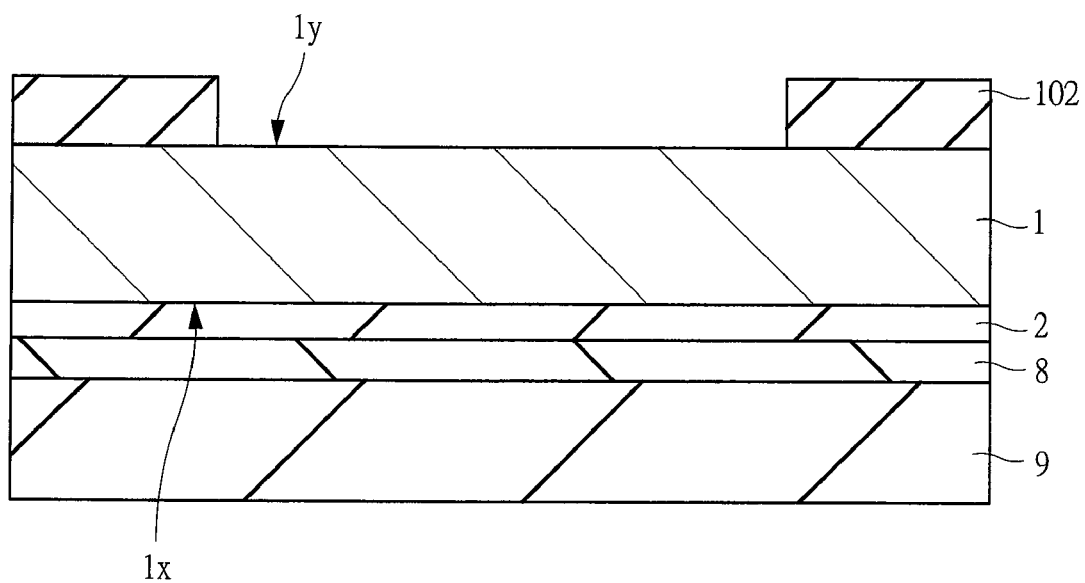
FIG. 34 is a schematic sectional view of a principal part of a semiconductor device in a manufacturing process according to still another embodiment of the present invention.
Figure 35:
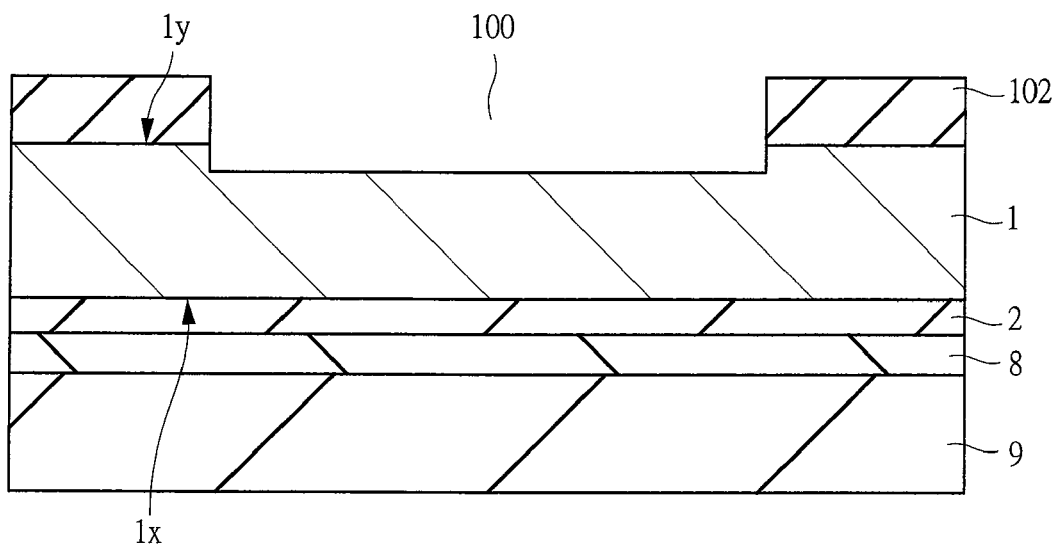
FIG. 35 is a schematic sectional view of the principal part of the semiconductor device in the manufacturing process continued from FIG. 34.
Figure 36:
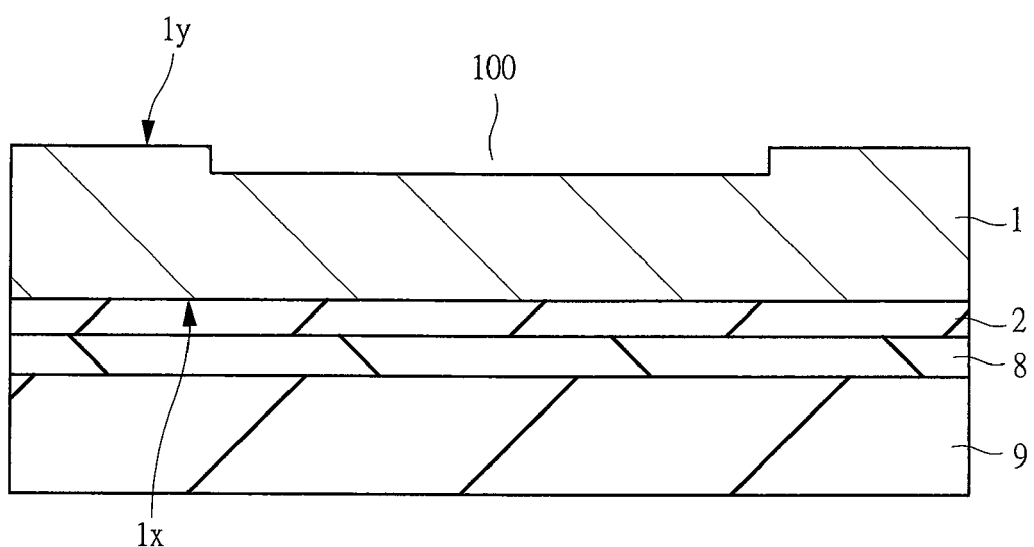
FIG. 36 is a schematic sectional view of the principal part of the semiconductor device in the manufacturing process continued from FIG. 35.

As shown in FIG. 34, a photoresist is coated on the rear surface 1y of the semiconductor substrate 1, and the resist mask 102 for processing the concave portion is formed by the photolithography method. Next, as shown in FIG. 35, the anisotropic etching of the ICP-RIE is performed to form the concave portion 100. A depth of the concave portion 100 is equal to or larger than a thickness of the rear-surface wire 4e to be formed later. And then, the resist mask 102 for processing the concave portion is removed from the semiconductor substrate 1 by the organic solvent and oxygen ashing (FIG. 36).

Figure 37:
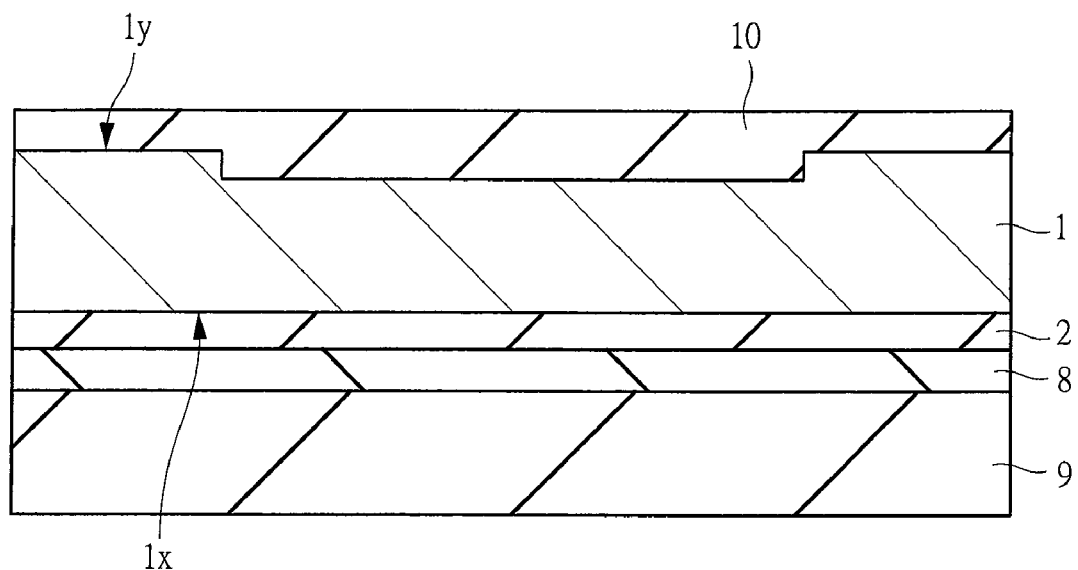
FIG. 37 is a schematic sectional view of the principal part of the semiconductor device in the manufacturing process continued from FIG. 36.
Figure 38:
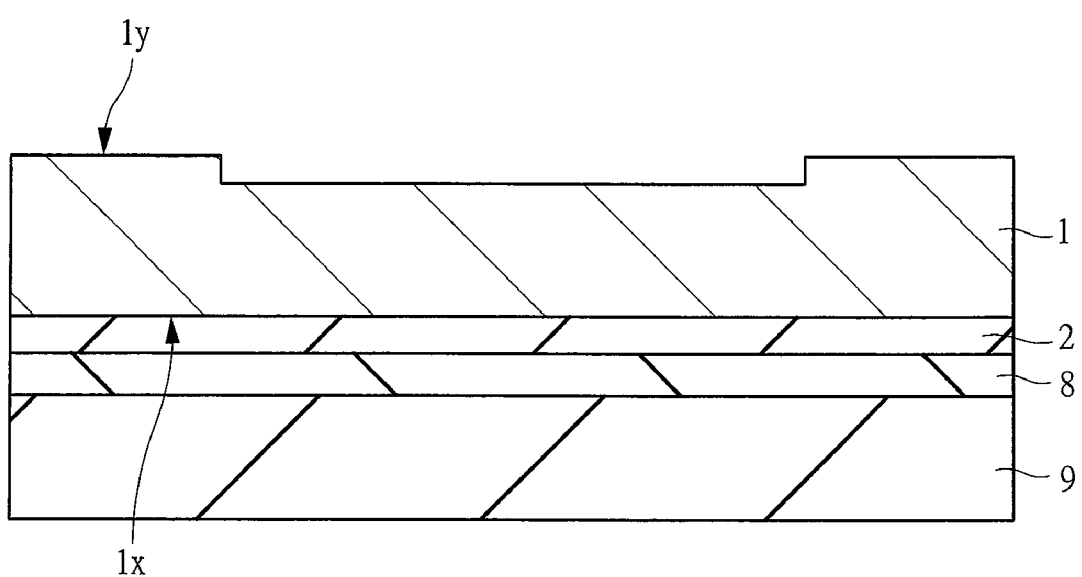
FIG. 38 is a schematic sectional view of the principal part of the semiconductor device in the manufacturing process continued from FIG. 37.
Figure 39:
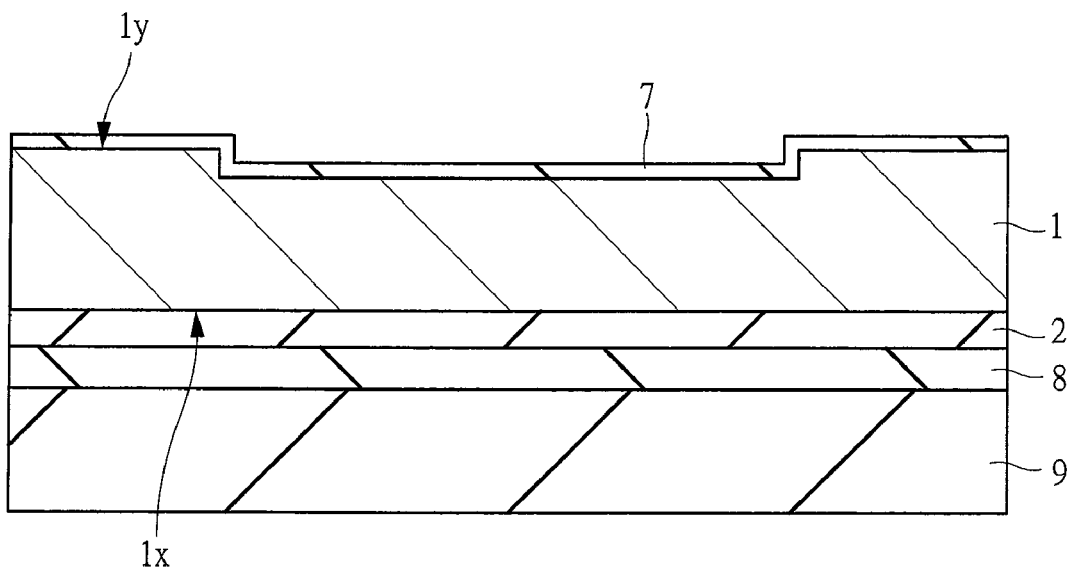
FIG. 39 is a schematic sectional view of the principal part of the semiconductor device in the manufacturing process continued from FIG. 38.

Subsequently, as shown in FIG. 37, a photoresist is coated on the semiconductor substrate 1, and the resist mask 10 is formed by the photolithography method so as to cover the concave portion. By this means, even if the process of FIG. 9 described in the first embodiment is performed, a region covered by the resist mask 10 is not processed. Next, after completing the formation of the hole 5, the residual resist mask 10 is rinsed by the organic solvent and oxygen ashing (FIGS. 38 and 12). Thereafter, as shown in FIG. 39, the insulating film 7 is formed by, for example, the CVD (Chemical vapor deposition) method on the whole rear surface 1y of the semiconductor substrate 1 including the concave portion 100. The insulating film 7 is formed along the inner wall and bottom surface inside the hole 5 so as to cover these surfaces (FIG. 14).

Figure 40:
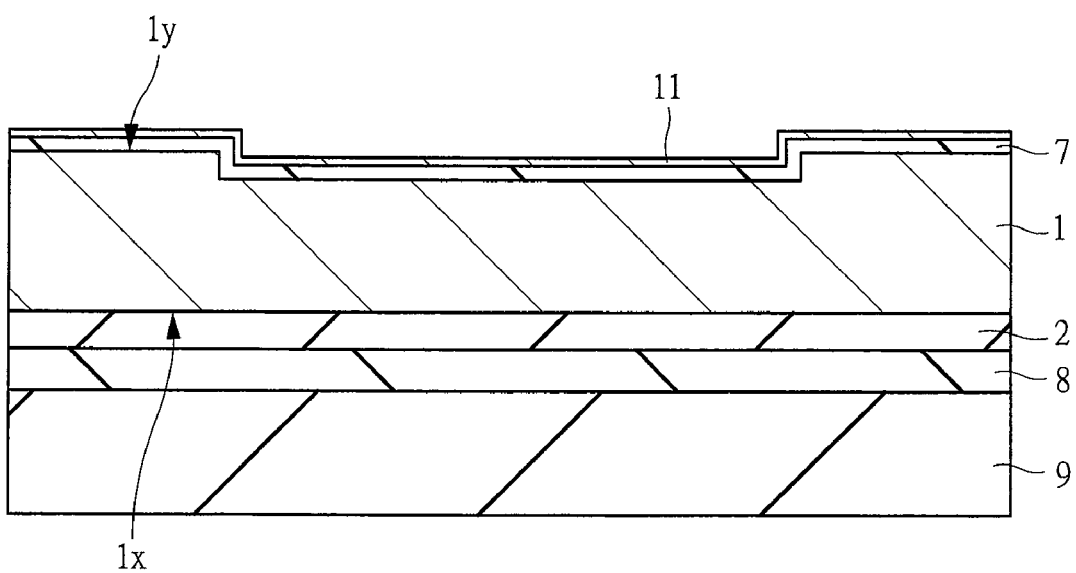
FIG. 40 is a schematic sectional view of the principal part of the semiconductor device in the manufacturing process continued from FIG. 39.
Figure 41:
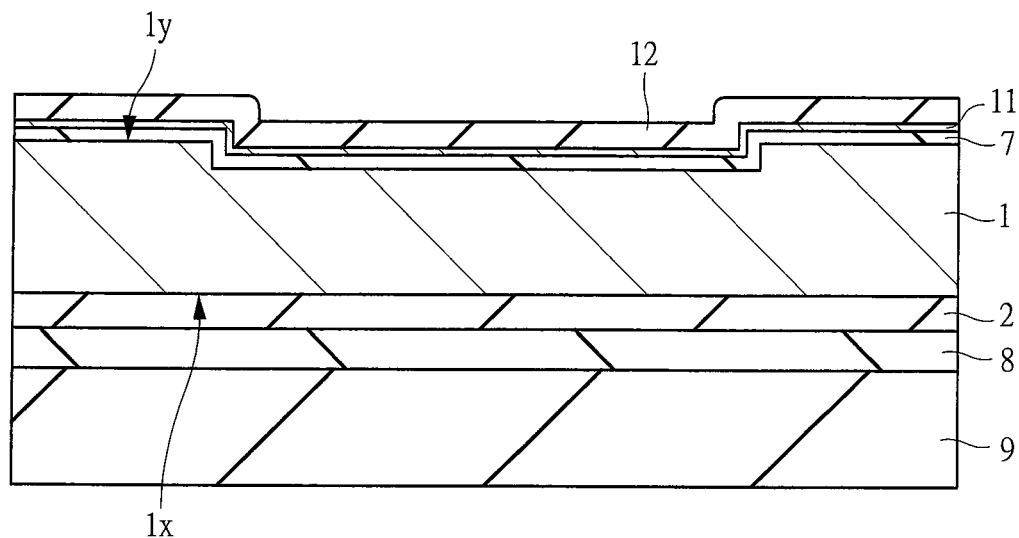
FIG. 41 is a schematic sectional view of the principal part of the semiconductor device in the manufacturing process continued from FIG. 40.
Figure 42:
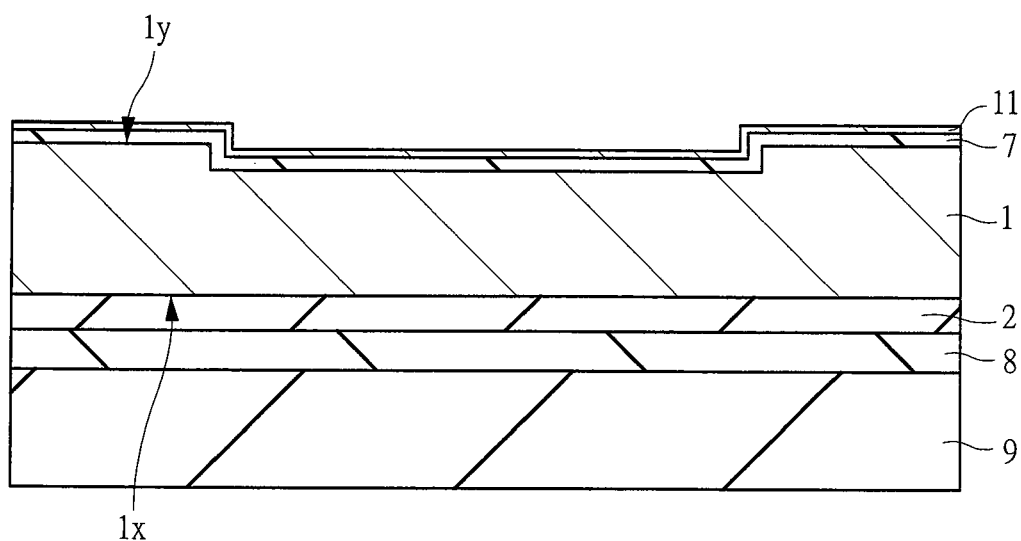
FIG. 42 is a schematic sectional view of the principal part of the semiconductor device in the manufacturing process continued from FIG. 41.

Subsequently, as shown in FIG. 40, the Al film 11 is formed by, for example, the sputtering method so as to cover the insulating film 7 including the concave portion 100. At this time, the Al film 11 for protecting the insulating film is formed also on the inner surface and bottom surface of the hole 5 (FIG. 15). The forming method may be the vapor deposition method. Next, as shown in FIG. 41, the resist mask 12 is formed so as to cover the concave portion 100. By this means, even if the processes shown in FIGS. 18 and 19 and described in the first embodiment are performed, the region covered by the resist mask 12 is not processed. Thereafter, the resist mask 12 for opening the contact hole is removed from the semiconductor substrate 1 by the organic solvent and oxygen ashing (FIG. 42).

Figure 43:
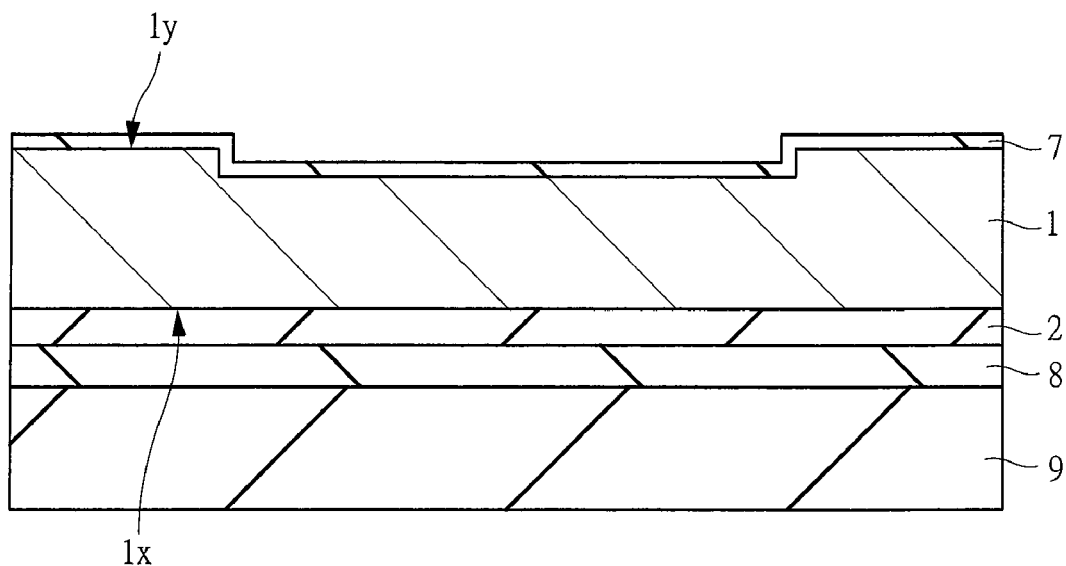
FIG. 43 is a schematic sectional view of the principal part of the semiconductor device in the manufacturing process continued from FIG. 42.
Figure 44:
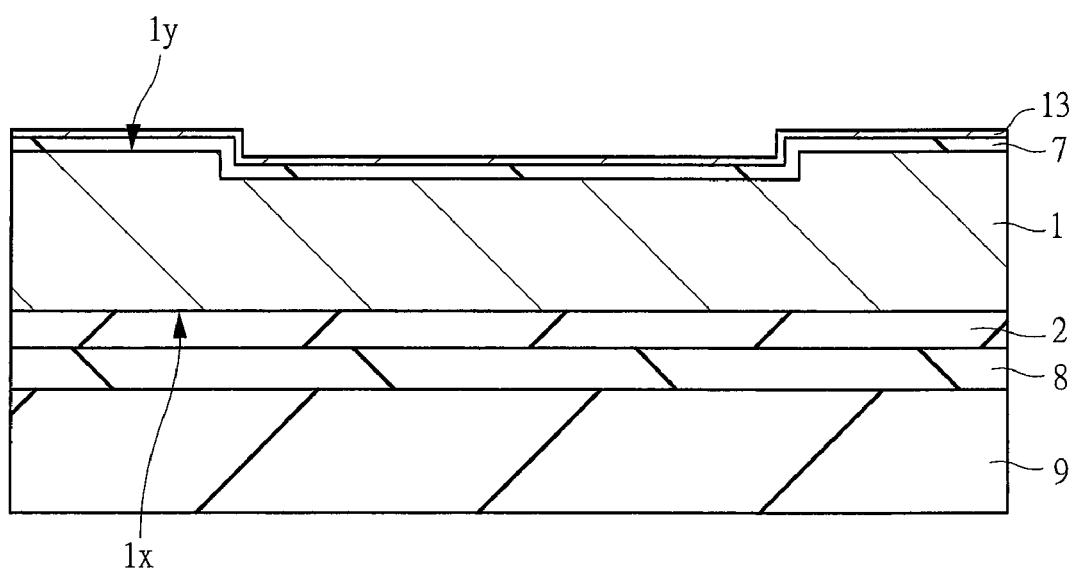
FIG. 44 is a schematic sectional view of the principal part of the semiconductor device in the manufacturing process continued from FIG. 43.
Figure 45:
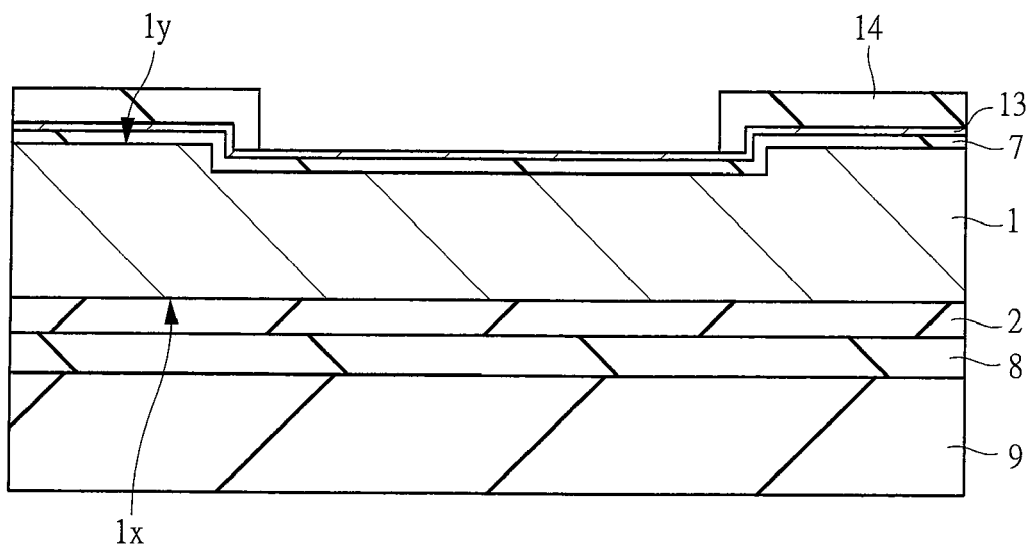
FIG. 45 is a schematic sectional view of the principal part of the semiconductor device in the manufacturing process continued from FIG. 44.

Subsequently, the Al film 11 for protecting the insulating film is removed by an etching solution for Al (FIG. 43). Next, in order to form the metal seed layer 13 by, for example, the sputtering method on the semiconductor substrate 1 including the inside of the hole 5 (FIG. 22), the metal seed layer 13 is formed on the insulating film 7 as shown in FIG. 44. Next, as shown in FIG. 45, the resist mask 14 for plating is formed by the photolithography technique on the metal seed layer 13.

Figure 46:
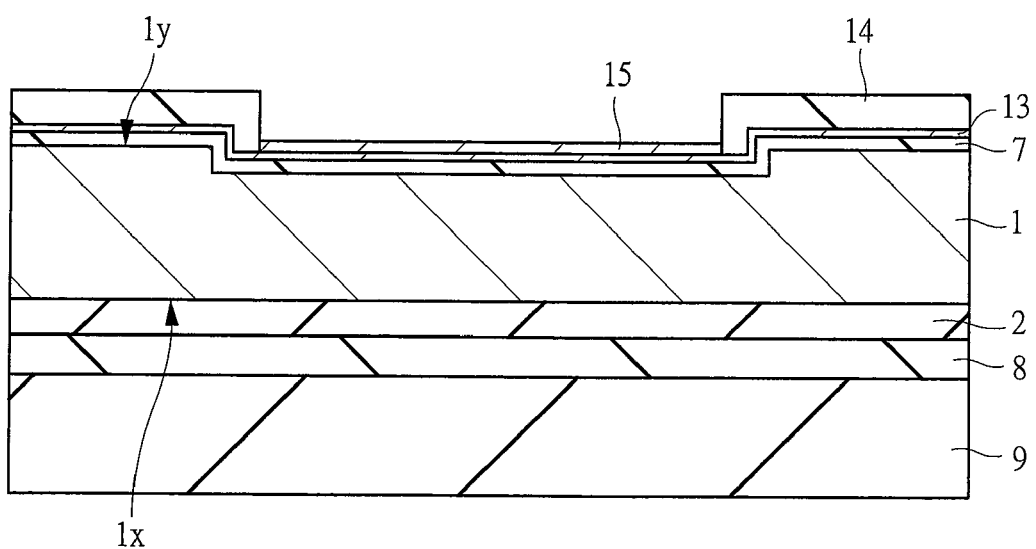
FIG. 46 is a schematic sectional view of the principal part of the semiconductor device in the manufacturing process continued from FIG. 45.
Figure 47:
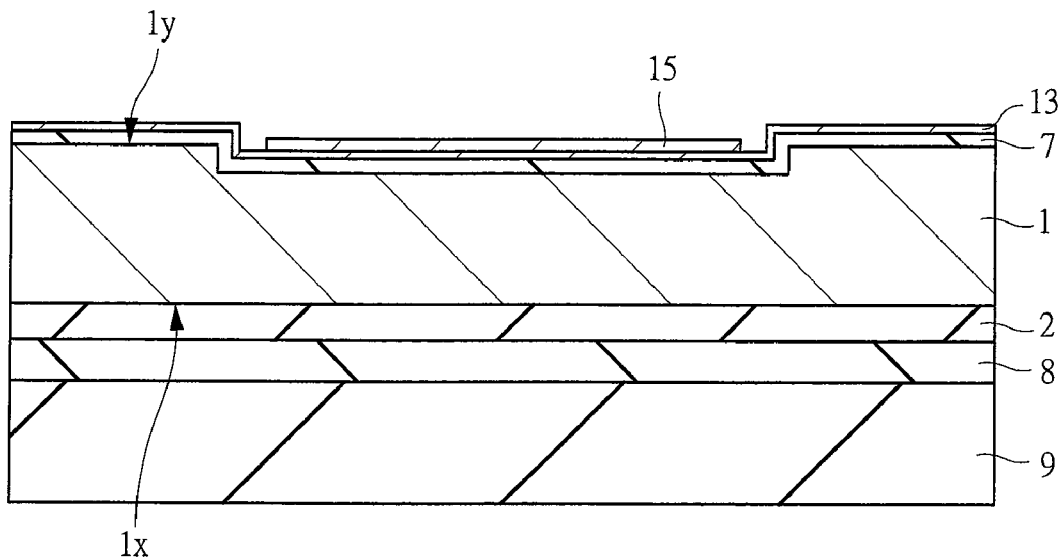
FIG. 47 is a schematic sectional view of the principal part of the semiconductor device in the manufacturing process continued from FIG. 46.
Figure 48:
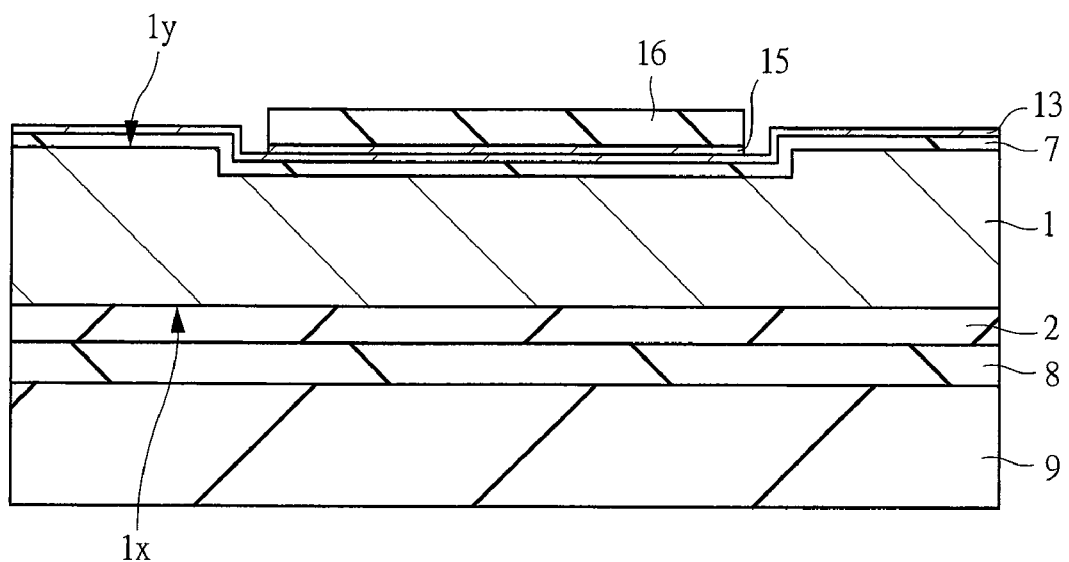
FIG. 48 is a schematic sectional view of the principal part of the semiconductor device in the manufacturing process continued from FIG. 47.

Subsequently, as shown in FIG. 46, the Au film 15 to be the rear-surface wire 4e is formed by, for example, the electrolytic plating method on the metal seed layer 13 exposed from the opening portion of the resist mask 14. The Au film 15 configures the inner electrode 4c and the rear-surface wiring pad 4d (FIG. 24). Next, the resist mask 14 for plating is removed from the semiconductor substrate 1 by the organic solvent and oxygen ashing (FIG. 47). Thereafter, as shown in FIG. 48, the resist is patterned by the photolithography process to form the resist mask 16 for protection on the metal seed layer 13. At this time, the resist mask 16 for protection is formed so as to cover the hole 5 and the rear-surface wiring pad 4d (FIG. 26).

Figure 49:
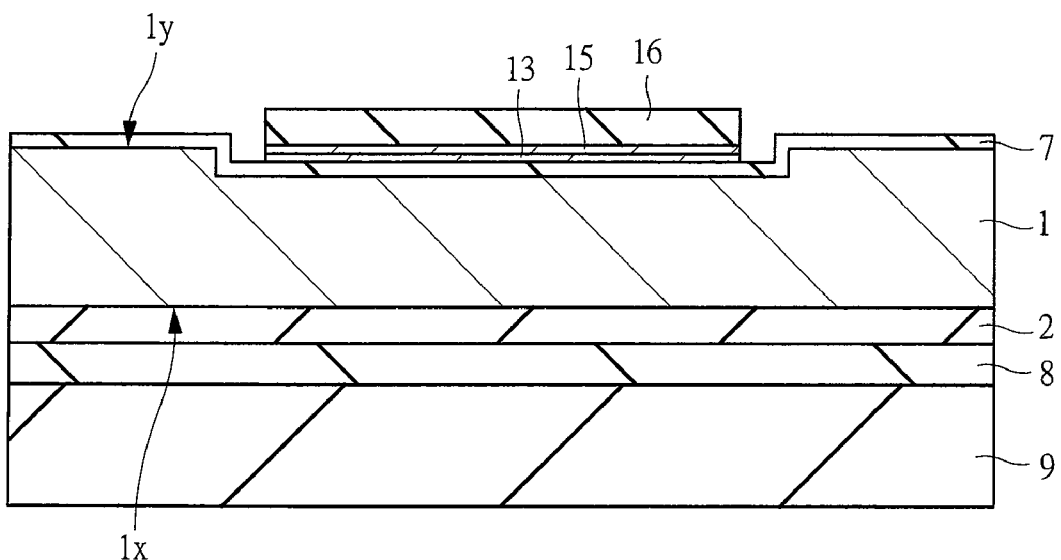
FIG. 49 is a schematic sectional view of the principal part of the semiconductor device in the manufacturing process continued from FIG. 48.
Figure 50:
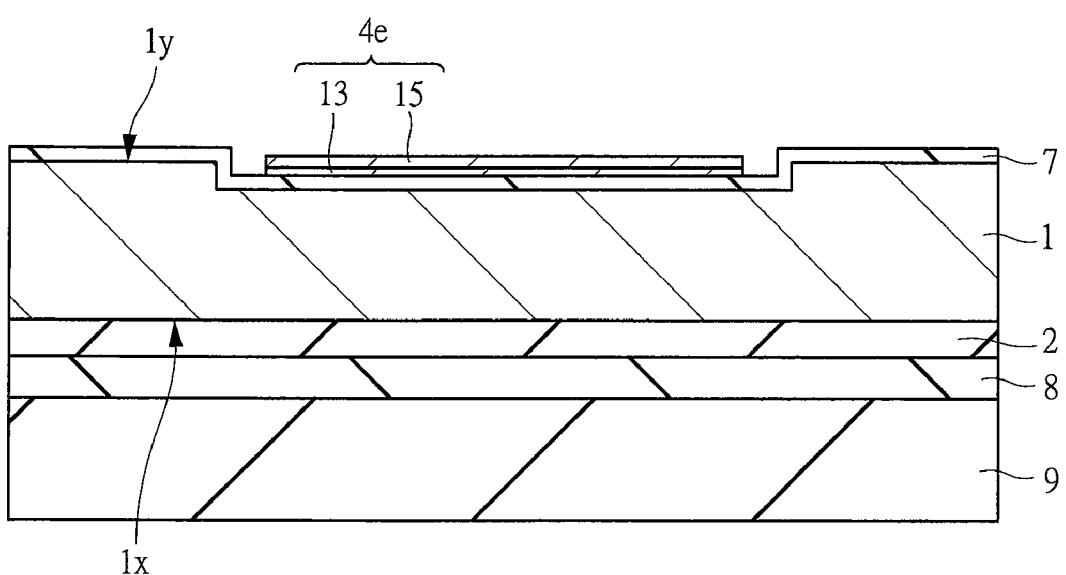
FIG. 50 is a schematic sectional view of the principal part of the semiconductor device in the manufacturing process continued from FIG. 49.

Subsequently, as shown in FIG. 49, the Au film and the Ti film which are the exposed metal seed layer 13 are removed by an etching solution for Au and an etching solution for Ti, respectively. Next, by removing the resist mask 16 for protection, the process of the semiconductor substrate 1 is completed (FIG. 50). By this means, the rear-surface wire 4e configured of the stacked film of the metal seed layer 13 and the Au film 15 is formed on the bottom surface of the concave portion 100 at the same time with the rear-surface wiring pad 4d described in the first embodiment.

Figure 51:
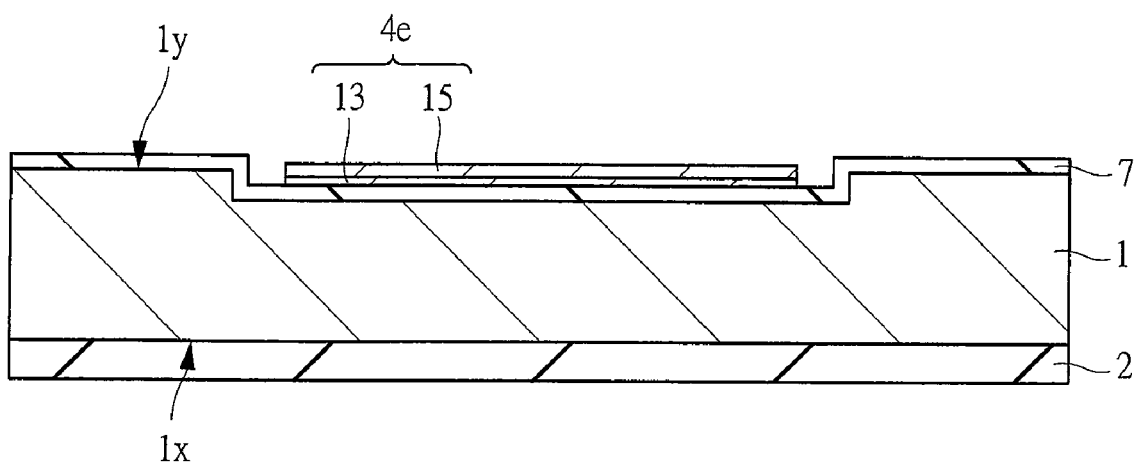
FIG. 51 is a schematic sectional view of the principal part of the semiconductor device in the manufacturing process continued from FIG. 50.

Subsequently, the supporting substrate 9 is peeled off from the semiconductor substrate 1. For example, if the adhesive layer 8 has a thermoplastic property, the peeling off is performed by heating (FIG. 51). Then, the wafer-like semiconductor substrate 1 is diced into the chips 1C by the blade dicing (FIG. 33).

If the present invention is applied when the rear-surface wire 4e is formed as described above, the formation of the convex portion on the rear surface 1y of the chip 1C (semiconductor substrate 1) can be prevented, so that the reduction of the sucking force of the chip can be prevented. Accordingly, in the semiconductor device according to the present embodiment, the manufacturing yield can be improved and the manufacturing cost can be reduced.

(Fourth Embodiment)

Figure 52:
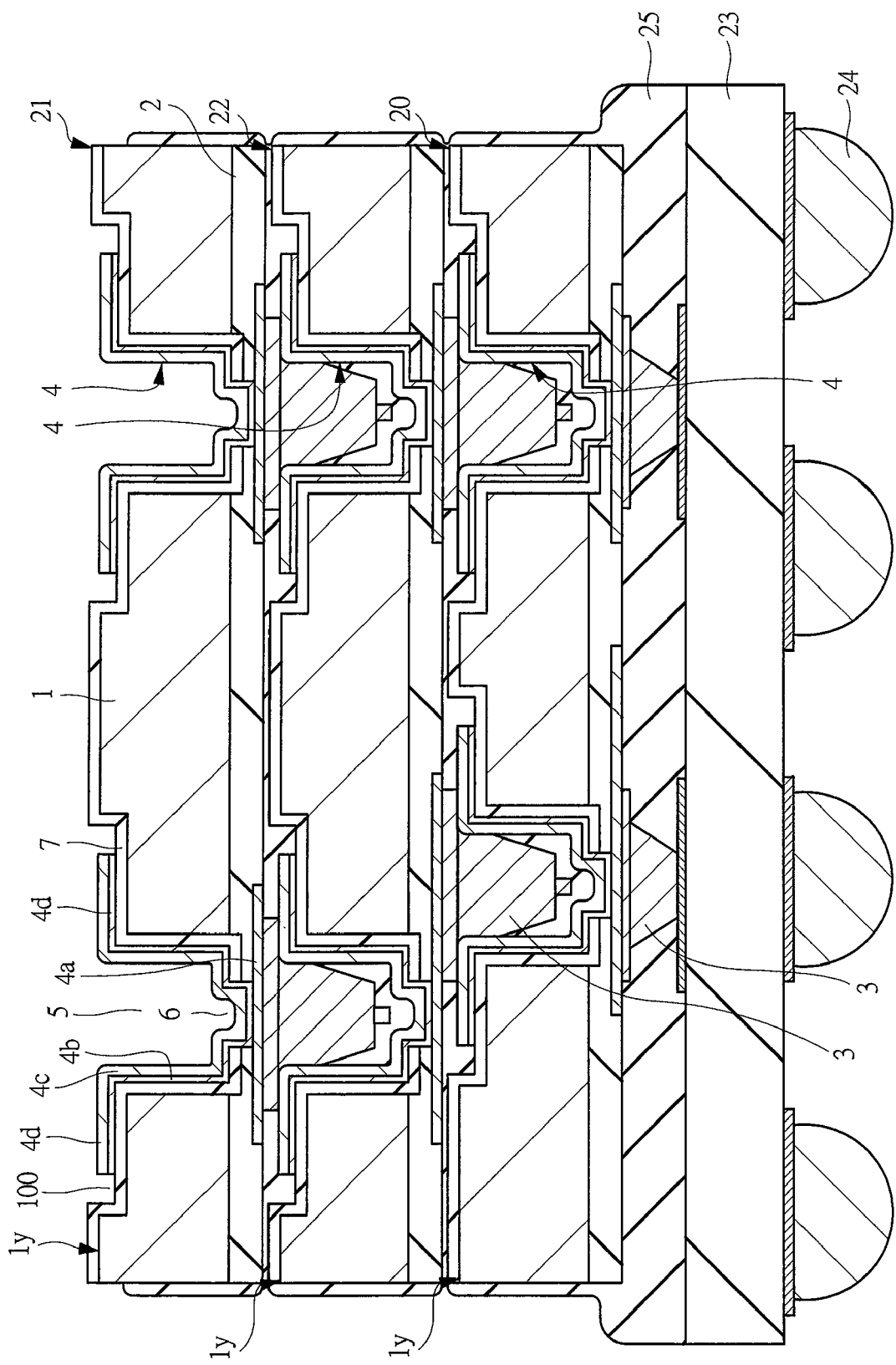
FIG. 52 is a schematic sectional view of a principal part of a semiconductor device according to still another embodiment of the present invention.
Figure 53:
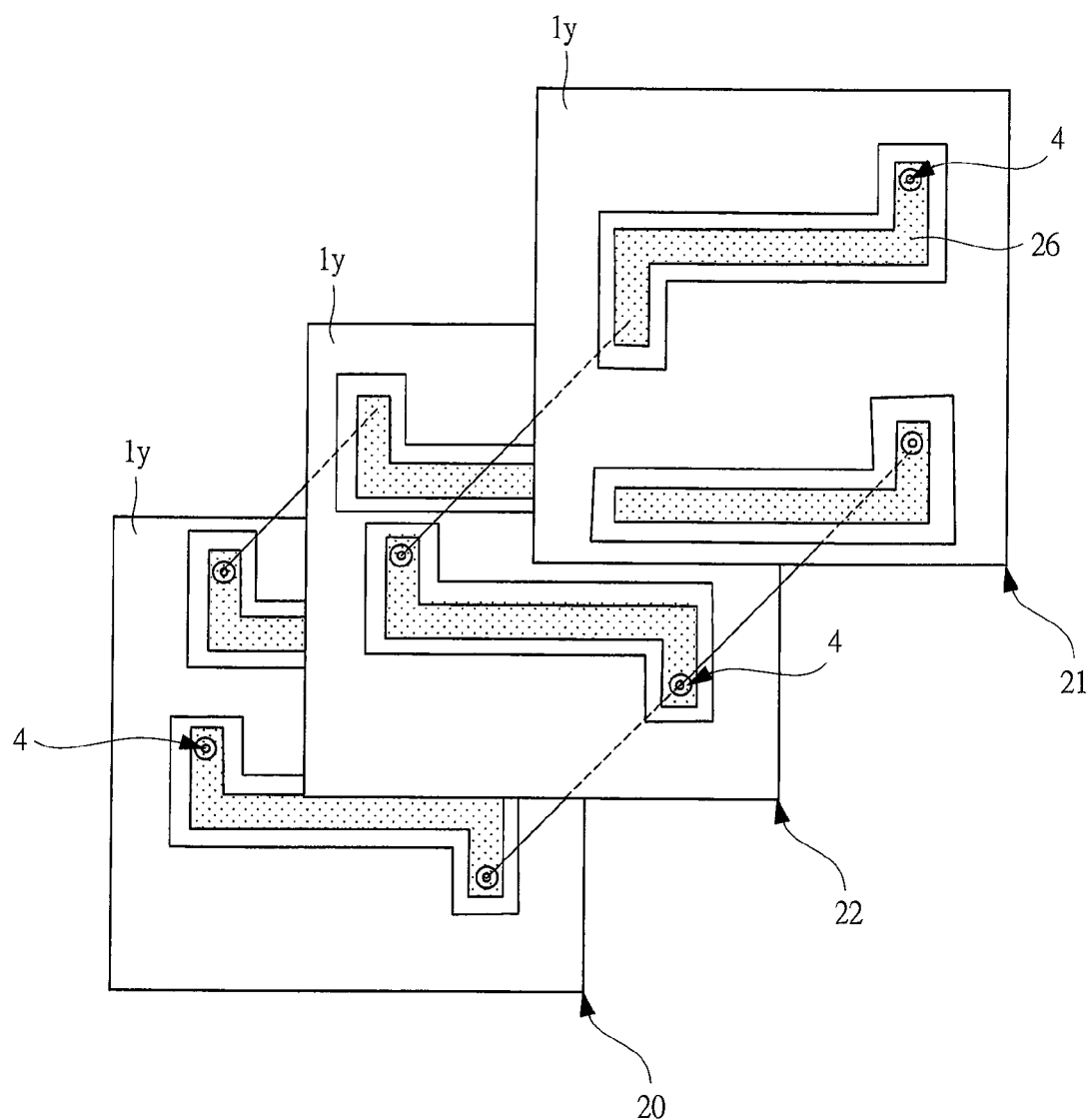
FIG. 53 is a schematic plan view showing the semiconductor device of FIG. 52 in an exploded manner.

In the present embodiment, a semiconductor device configured by stacking the semiconductor chips described in the first embodiment will be described. FIG. 52 is a schematic sectional view of the semiconductor device according to the present embodiment, and FIG. 53 is a schematic plan view showing the semiconductor device of FIG. 52 in an exploded manner.

In FIG. 52, in order to stack two chips mounting highly-integrated circuits of, for example, a microcomputer chip 20 and an SDRAM chip 21 each configured of the semiconductor chip described in the first embodiment, an interposer chip 22 for rewiring is inserted between the two chips, and they are mounted on a wiring substrate 23.

The stud bump 3 formed in an upper chip is deformed and injected into the hollow through-hole electrode 4 formed in a lower chip by pressure welding, and the stud bump and the through-hole electrode are geometrically caulked, so that the chips are electrically connected to each other. Solder bumps 24 are formed on a lower side of the wiring substrate 23 and are used for external connection. In this manner, the through-hole electrode 4 of the microcomputer chip 20 and the stud bump 3 of the interposer chip 22 are geometrically caulked, and the interposer chip 22 is stacked on the rear surface 1y of the microcomputer chip 20. Also, the through-hole electrode 4 of the interposer chip 22 and the stud bump 3 of the SDRAM chip 21 are geometrically caulked, and the SDRAM chip 21 is stacked on the rear surface 1y of the interposer chip 22.

After stacking each of the chips (microcomputer chip 20, SDRAM chip 21, and interposer chip 22) and the wiring substrate 23, spaces among each of the chips and the wiring substrate 23 are filled by a sealing adhesive material 25, so that a mechanical strength is increased to improve the handling properties in the assembling of the semiconductor device, and further, the semiconductor element is protected from an external environment.

As shown in FIG. 53, a rear-surface wire 26 is formed on the rear surface 1y of each of the chips, and the wires of the chips are three-dimensionally connected to each other via the through-hole electrode 4 to configure the three dimensional wiring. Therefore, the rear-surface wire 26 can be used as a same potential line, and the use as a ground line, a power supply line, and a signal line is conceivable. Since a wire inductance of the whole semiconductor device can be reduced by such a use, an operation speed can be increased.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, although the case where the chips are stacked by geometrically caulking the stud bump and the through-hole electrode has been described in the embodiments above, the present invention can be applied also to the case of caulking the through-hole electrode and a solder bump or a plating bump instead of the stud bump.

The present invention is widely used for a semiconductor device, more particularly, for the manufacturing industry of a semiconductor device having a plurality of semiconductor chips stacked three-dimensionally.

What is claimed is:

1. A semiconductor device comprising:
   a semiconductor substrate having a first surface and a second surface located on an opposite side to the first surface;
   an interlayer insulating film formed on the first surface of the semiconductor substrate;
   a first conductive film formed on the first surface of the semiconductor substrate via the interlayer insulating film;
   a concave portion formed on the second surface of the semiconductor substrate;
   a hole formed in a bottom surface of the concave portion and reaching the first conductive film;
   an insulating film formed on the bottom surface of the concave portion; and
   a second conductive film formed on the bottom surface of the concave portion via the insulating film and formed on a bottom surface of the hole so as to be electrically connected to the first conductive film,
   the hole, the insulating film, and the second conductive film configuring a through-hole electrode, and
   the through-hole electrode including:
   a first hole which configures the hole and reaches the interlayer insulating film from the bottom surface of the concave portion;
   a second hole which configures the hole and reaches the first conductive film from the bottom surface of the first hole, and whose hole diameter is smaller than that of the first hole;
   the insulating film formed on the bottom surface and a side surface of the first hole; and
   the second conductive film formed on the bottom surface and the side surface of the first hole and on the bottom surface of the concave portion via the insulating film, and formed on a bottom surface of the second hole so as to be electrically connected to the first conductive film.

2. The semiconductor device according to claim 1, wherein
   the second conductive film is placed inside the concave portion, and
   the hole, the insulating film, and the second conductive film configure a through-hole electrode, and
   the through-hole electrode includes:
   a first hole which configures the hole and reaches the interlayer insulating film from the bottom surface of the concave portion, and whose bottom surface is located at a position closer to the first conductive film than a boundary between the interlayer insulating film and the semiconductor substrate;
   a second hole which configures the hole and reaches the first conductive film from the bottom surface of the first hole, and whose hole diameter is smaller than that of the first hole;
   the insulating film formed on the bottom surface and a side surface of the first hole and on the bottom surface of the concave portion; and
   the second conductive film formed on the bottom surface and the side surface of the first hole and on the bottom surface of the concave portion via the insulating film, and formed on a bottom surface of the second hole so as to be electrically connected to the first conductive film.

3. The semiconductor device according to claim 1, wherein
   the through-hole electrode of the semiconductor substrate and a bump electrode of an other semiconductor substrate are geometrically caulked, so that the other semiconductor substrate is stacked on the second surface of the semiconductor substrate.

4. The semiconductor device according to claim 3, wherein
   the second conductive film on the bottom surface of the concave portion configures a wire electrically connected to the through-hole electrode, and
   a three dimensional wire is configured of the through-hole electrode, the bump electrode, and the wire.

5. The semiconductor device according to claim 4, wherein the three dimensional wire configures a same potential line.

6. A manufacturing method of a semiconductor device comprising the steps of:
   (a) preparing a semiconductor substrate having a first surface and a second surface located on an opposite side to the first surface;
   (b) forming an interlayer insulating film on the first surface of the semiconductor substrate;
   (c) forming a first conductive film on the first surface of the semiconductor substrate via the interlayer insulating film;
   (d) forming a concave portion on the second surface of the semiconductor substrate;
   (e) forming an insulating film on a bottom surface of the concave portion;
   (f) forming a hole reaching the first conductive film in the bottom surface of the concave portion; and
   (g) forming a second conductive film on the bottom surface of the concave portion via the insulating film and on a bottom surface of the hole so as to be electrically connected to the first conductive film;
   wherein the hole, the insulating film, and the second conductive film configure a through-hole electrode;

(h) forming a first hole in the through-hole electrode which configures the hole and reaches the interlayer insulating film from the bottom surface of the concave portion;

(i) forming a second hole which configures the hole and reaches the first conductive film from the bottom surface of the first hole, and whose hole diameter is smaller than that of the first hole;

wherein, the insulating film is formed on the bottom surface and a side surface of the first hole; and the second conductive film is formed on the bottom surface and the side surface of the first hole and on the bottom surface of the concave portion via the insulating film, and formed on a bottom surface of the second hole so as to be electrically connected to the first conductive film.

7. The manufacturing method of the semiconductor device according to claim 6, wherein in the step (d), the concave portion equal to or deeper than a thickness of the second conductive film is formed.

8. The manufacturing method of the semiconductor device according to claim 6, wherein in the step (g), a wire and a wiring pad configured of the second conductive film are simultaneously formed on the bottom surface of the concave portion.

9. The manufacturing method of the semiconductor device according to claim 6, wherein in the step (g), the second conductive film is formed by stacking a metal seed layer and a plating layer, and after the step (f), the metal seed layer is formed on the bottom surface of the concave portion via the insulating film and formed so as to be electrically connected to the first conductive film on the bottom surface of the hole, and the plating layer is formed on the metal seed layer.

10. A manufacturing method of a semiconductor device comprising the steps of:

(a) preparing a semiconductor substrate having a main surface and a rear surface located on an opposite side to the main surface, and then, forming a semiconductor element on the main surface of the semiconductor substrate and forming an interlayer insulating film on the main surface of the semiconductor substrate;

(b) forming a main-surface wiring pad on the main surface of the semiconductor substrate via the interlayer insulating film;

(c) forming a first resist mask on the rear surface of the semiconductor substrate and forming a concave portion by etching on the semiconductor substrate with using the first resist mask, and then, removing the first resist mask;

(d) forming a second resist mask having an opening portion in a part of a bottom surface of the concave portion corresponding to a position of the main-surface wiring pad and forming a first hole by etching in the semiconductor substrate with using the second resist mask, and then, removing the second resist mask;

(e) forming an insulating film on the rear surface of the semiconductor substrate including an inside portion of the first hole;

(f) forming an aluminum film on the insulating film;

(g) after the step (f), forming a third resist mask having an opening portion in a part of the bottom surface of the first hole, removing each of the aluminum film, the insulating film, the semiconductor substrate, and the interlayer insulating film by etching with using the third resist mask, and forming a second hole reaching the main-surface wiring pad, and then, removing the third resist mask;

(h) forming a metal seed layer on a bottom surface and a side surface of each of the second hole, the first hole, and the concave portion and on the rear surface of the semiconductor substrate;

(i) forming a fourth resist mask having an opening portion in a part of the concave portion, the first hole, and the second hole and forming a plating layer on the metal seed layer by a plating method with using the fourth resist mask, and then, removing the fourth resist mask; and (j) forming a fifth resist mask for covering the plating layer and removing a portion of the metal seed layer which is not covered by the fifth resist mask, thereby forming a rear-surface wiring pad configured of the metal seed layer and the plating layer on the bottom surface of the concave portion, and then, removing the fifth resist mask.

* * * * *